(12) United States Patent
Choi et al.

(10) Patent No.: US 11,963,395 B2
(45) Date of Patent: Apr. 16, 2024

(54) ELECTRONIC APPARATUS WITH POLARIZATION PLATE AND MANUFACTURING METHOD THEREOF

(71) Applicant: Samsung Display Co., LTD., Yongin-si (KR)

(72) Inventors: Young Seo Choi, Yongin-si (KR); Sungchul Kim, Seongnam-si (KR); Kwanhee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 408 days.

(21) Appl. No.: 17/243,033

(22) Filed: Apr. 28, 2021

(65) Prior Publication Data
US 2022/0020969 A1    Jan. 20, 2022

(30) Foreign Application Priority Data

Jul. 17, 2020  (KR) .......................... 10-2020-0089128

(51) Int. Cl.
*H10K 50/80* (2023.01)
*H01L 21/67* (2006.01)
*H10K 50/86* (2023.01)
*H10K 71/00* (2023.01)

(52) U.S. Cl.
CPC ..... *H10K 50/868* (2023.02); *H01L 21/67028* (2013.01); *H10K 50/865* (2023.02); *H10K 71/00* (2023.02)

(58) Field of Classification Search
CPC .... H10K 50/868; H10K 50/865; H10K 71/00; H10K 50/86; H10K 59/121; H10K 59/00; H10K 59/12; H10K 59/60; H10K 59/65; H10K 59/122; H10K 59/50; H10K 50/85; H10K 50/852; H01L 21/67028; H01L 21/67051; H01L 21/67132; H01L 21/67138; H01L 21/67144; H01L 21/67225; H01L 21/6704; G02B 5/3033;
(Continued)

(56) References Cited

U.S. PATENT DOCUMENTS

| 10,429,560 B2 | 10/2019 | Lee et al. |
| 10,436,960 B2 | 10/2019 | Lee et al. |
| 2017/0283636 A1 | 10/2017 | Choi et al. |

(Continued)

FOREIGN PATENT DOCUMENTS

| KR | 10-1737175 | 5/2017 |
| KR | 10-2017-0103159 | 9/2017 |

(Continued)

*Primary Examiner* — John P. Dulka
(74) *Attorney, Agent, or Firm* — H.C. Park & Associates, PLC

(57) ABSTRACT

An electronic apparatus includes: an electronic module; a display panel disposed on the electronic module and including a first display region and a second display region adjacent to the first display region, the second display region overlapping the electronic module; and a polarization plate disposed on the display panel and including a first polarization region overlapping the first display region and a second polarization region including a polarization part and a non-polarization part having higher light transmittance than the polarization part, the non-polarization part overlapping the second display region.

12 Claims, 17 Drawing Sheets

(58) Field of Classification Search
CPC .... G02B 5/305; G02B 5/3025; G02B 5/3041; G02B 5/223
See application file for complete search history.

(56) References Cited

U.S. PATENT DOCUMENTS

2018/0315357 A1* 11/2018 Nam .................... H10K 50/868
2020/0286436 A1   9/2020 Lim
2021/0389514 A1* 12/2021 Chai ................... H10K 59/122

FOREIGN PATENT DOCUMENTS

| KR | 10-1827604 | 2/2018 |
| KR | 10-1964604 | 4/2019 |
| KR | 10-2002369 | 7/2019 |

* cited by examiner

ELECTRONIC APPARATUS WITH POLARIZATION PLATE AND MANUFACTURING METHOD THEREOF

CROSS REFERENCE TO RELATED APPLICATION

This application claims priority from and the benefit of Korean Patent Application No. 10-2020-0089128, filed on Jul. 17, 2020, which is hereby incorporated by reference for all purposes as if fully set forth herein.

BACKGROUND

Field

Embodiments of the invention relate generally to an electronic apparatus and a manufacturing method thereof, and more specifically, to an electronic apparatus including a patterned polarization layer and a manufacturing method thereof.

Discussion of the Background

Various types of display devices have been used to provide image information, and the display devices may each include an electronic module that receives external signals or provides output signals to the outside. For example, the electronic module may include a camera module, a sensor, a sound module, or the like, and in order to increase a region for displaying an image, it is being considered to dispose the electronic module or the like in the region for displaying an image.

Accordingly, it is demanded to maintain display quality and to improve the sensitivity of the electronic module in the region in which the electronic module is disposed.

The above information disclosed in this Background section is only for understanding of the background of the inventive concepts, and, therefore, it may contain information that does not constitute prior art.

SUMMARY

Applicant discovered that when a display device with an electronic module is manufactured with a polarization layer on the electronic module, the polarization layer overlapping the electronic module may degrade the performance of the electronic module.

Display devices with an electronic module constructed according to the principles of the invention are capable of improving the performance of the electronic module and the display quality of the display devices by increasing transmittance in a display region overlapping the electronic module through providing a patterned polarization layer.

Methods of manufacturing the display devices according to the principles of the invention improve the performance of the electronic module and the display quality of the display devices by increasing transmittance in the display region overlapping the electronic module through providing the patterned polarization layer.

Additional features of the inventive concepts will be set forth in the description which follows, and in part will be apparent from the description, or may be learned by practice of the inventive concepts.

According to an aspect of the invention, an electronic apparatus includes: an electronic module; a display panel disposed on the electronic module and including a first display region and a second display region adjacent to the first display region, the second display region overlapping the electronic module; and a polarization plate disposed on the display panel and including a first polarization region overlapping the first display region and a second polarization region including a polarization part and a non-polarization part having higher light transmittance than the polarization part, the non-polarization part overlapping the second display region.

The polarization plate may include a polarizer layer as an uppermost layer, and the polarizer layer may include a polymer film and a light absorber dispersed in the polymer film.

A number of the light absorber per unit area in the non-polarization part may be smaller than a number of the light absorber per unit area in the first polarization region and the polarization part.

The non-polarization part may be formed by removing the light absorber from the polymer film.

The display panel may include: a base layer; a circuit layer disposed on the base layer and including at least one metal pattern; and a light-emitting element layer disposed on the circuit layer and including a first electrode and a second electrode facing each other, and an emission layer disposed between the first electrode and the second electrode, wherein the second display region may include a non-pixel region that may not include the at least one metal pattern and the first electrode, and a pixel region that may include the at least one metal pattern and the first electrode.

The non-pixel region may overlap the non-polarization part, and the pixel region may overlap the polarization part.

The polarization part may overlap at least one among the at least one metal pattern and the first electrode; and the non-polarization part may not overlap both the at least one metal pattern and the first electrode.

The at least one metal pattern may include at least one among a lower shield pattern, a transistor, and a connection electrode.

The non-polarization part may not overlap the at least one metal pattern.

Each of the first display region and the second display region may include a plurality of pixel units; and a number of the pixel units per unit area in the second display region may be smaller than a number of the pixel units per unit area in the first display region.

Each of the plurality of pixel units may include a first color light-emitting region, a second color light-emitting region, and a third color light emitting region.

The first display region may include a first pixel unit including a plurality of light-emitting regions arranged spaced apart from each other when viewed in a plane; and the second display region may include a second pixel unit may include a plurality of light-emitting regions arranged different from an arrangement of the plurality of light-emitting regions in the first pixel unit.

The second display region may have a lower pixel density or a lower wiring density than the first display region.

The electronic apparatus may further include a support member disposed under the display panel and including a through-hole overlapping the electronic module.

According to another aspect of the invention, a manufacturing method of an electronic apparatus includes the steps of: providing a display panel including a first display region and a second display region adjacent to the first display region, the second display region having different transmittance from the first display region; providing, on the display panel, a polarization plate including a first polarization region overlapping the first display region and a second polarization region overlapping the second display region; and patterning the provided polarization plate, wherein the step of patterning of the polarization plate includes the steps of: irradiating laser light in the second display region from under the display panel; and providing a cleaning liquid to the second polarization region from above the polarization plate.

The polarization plate may include a polarizer layer disposed in the first polarization region and the second polarization region; the polarizer layer may include a polymer film and a light absorber dispersed in the polymer film; the step of irradiating the laser light in the second display region may include the step of detaching the light absorber in the polymer film; and the step of providing of the cleaning liquid may include the step of extracting the detached light absorber.

The step of patterning of the polarization plate may include the step of patterning the second polarization region into a polarization part and a non-polarization part having higher light transmittance than the polarization part; and the non-polarization part may be a portion formed by detaching the light absorber from the polymer film.

The display panel may include: a base layer; a circuit layer disposed on the base layer and including a metal pattern; and a light-emitting element layer disposed on the circuit layer and including a first electrode, a second electrode, and an emission layer disposed between the first electrode and the second electrode, and in the step of irradiating the laser light in the second display region, the laser light may be irradiated in a direction to the polarization plate from under the base layer by using at least one among the metal pattern or the first electrode serving as a mask.

The step of patterning of the polarization plate may include the step of patterning the second polarization region so as to include a polarization part that may overlap at least one among the metal pattern or the first electrode and a non-polarization part that may not overlap the metal pattern and the first electrode.

The laser light may be selected from a wavelength range of about 340 nm to about 810 nm.

The step of irradiating the laser light in the second display region and the step of providing of the cleaning liquid may be performed in a same step.

The step of providing of the cleaning liquid may include the step of providing the cleaning liquid by using a spray method, a steam jet method, or a dipping method.

The cleaning liquid may be a neutral solution.

The cleaning liquid may be deionized water.

The manufacturing method may further include the step of disposing an electronic module under the display panel after the step of patterning of the polarization plate.

The step of disposing of the electronic module may include the step of disposing the electronic module so as to overlap the second display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
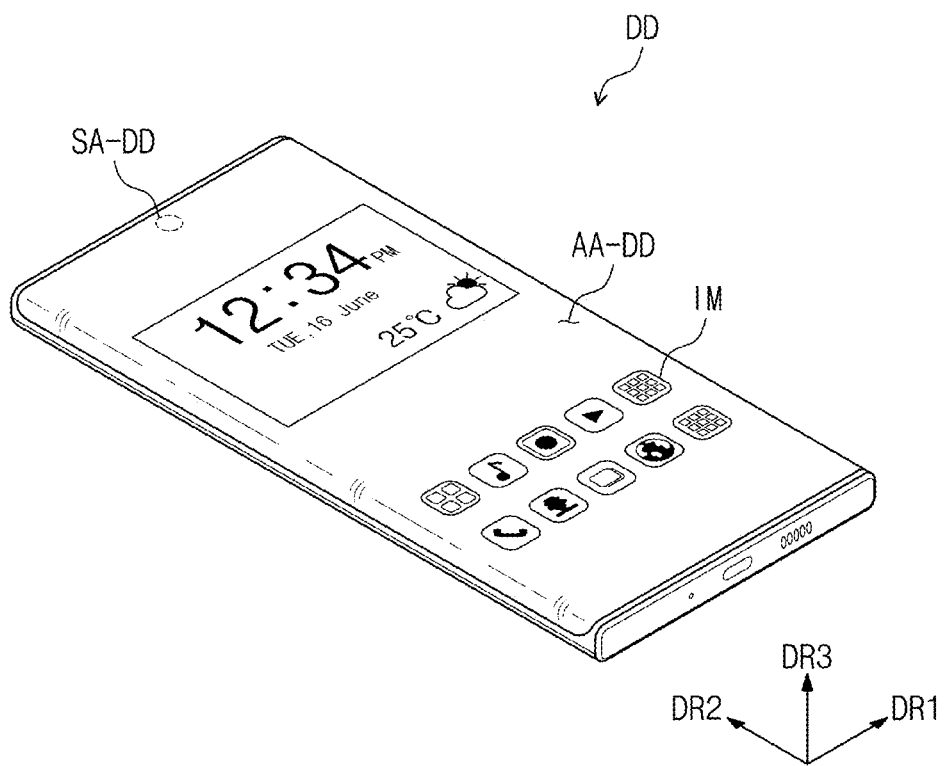
FIG. 1 is a perspective view of an embodiment of an electronic apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an electronic apparatus according to an embodiment of the inventive concept will be described with reference to drawings.

Figure 2:
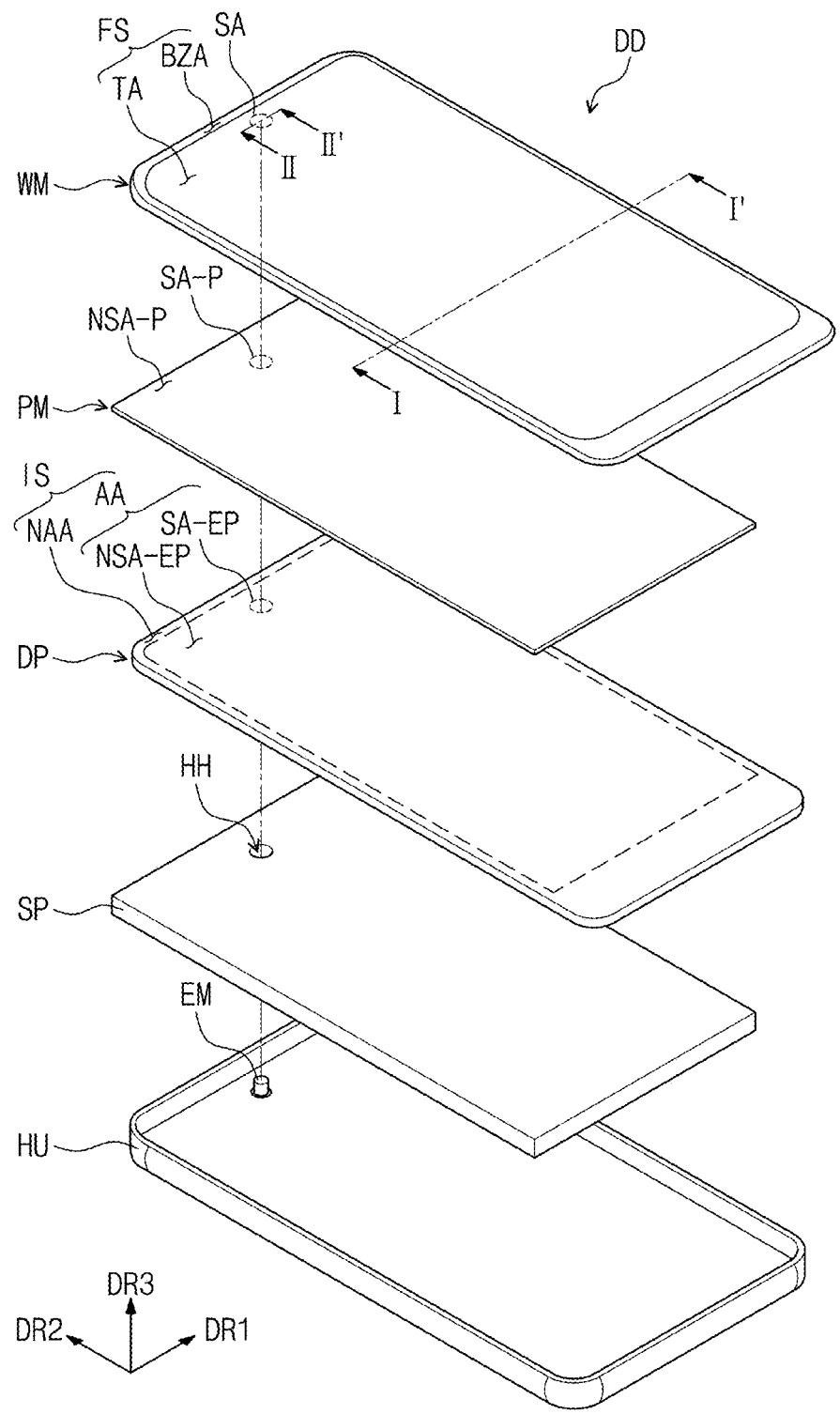
FIG. 2 is an exploded perspective view of the electronic apparatus of FIG. 1.
Figure 3:
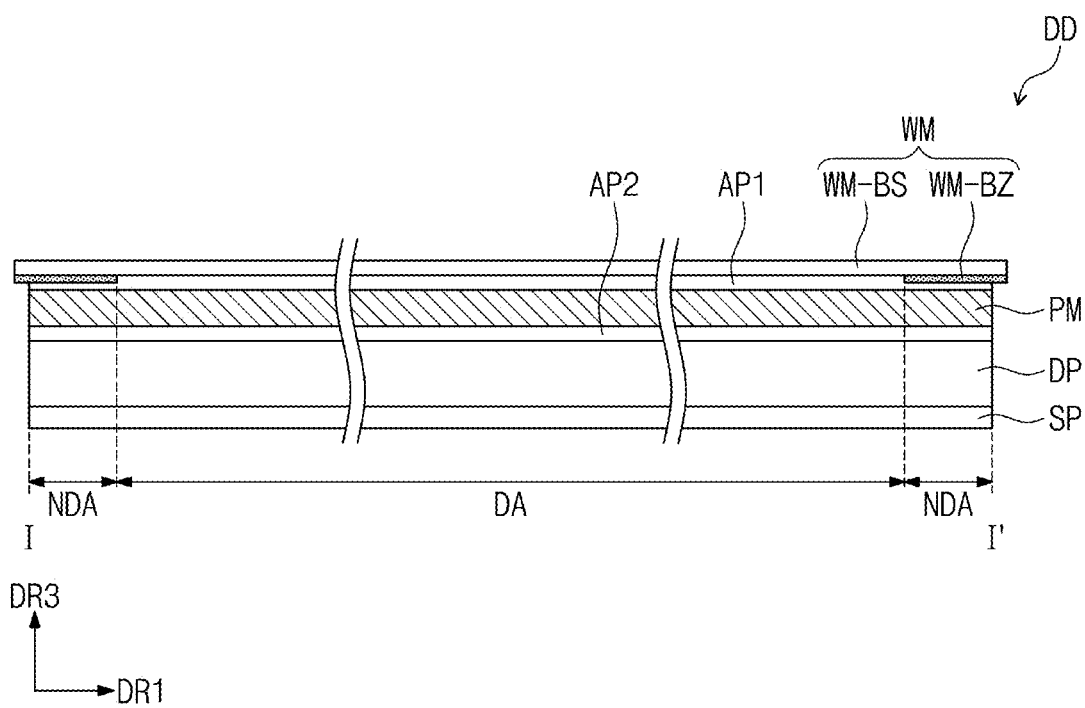
FIG. 3 is a cross-sectional view taken along line I-I' of FIG. 2.
Figure 4:
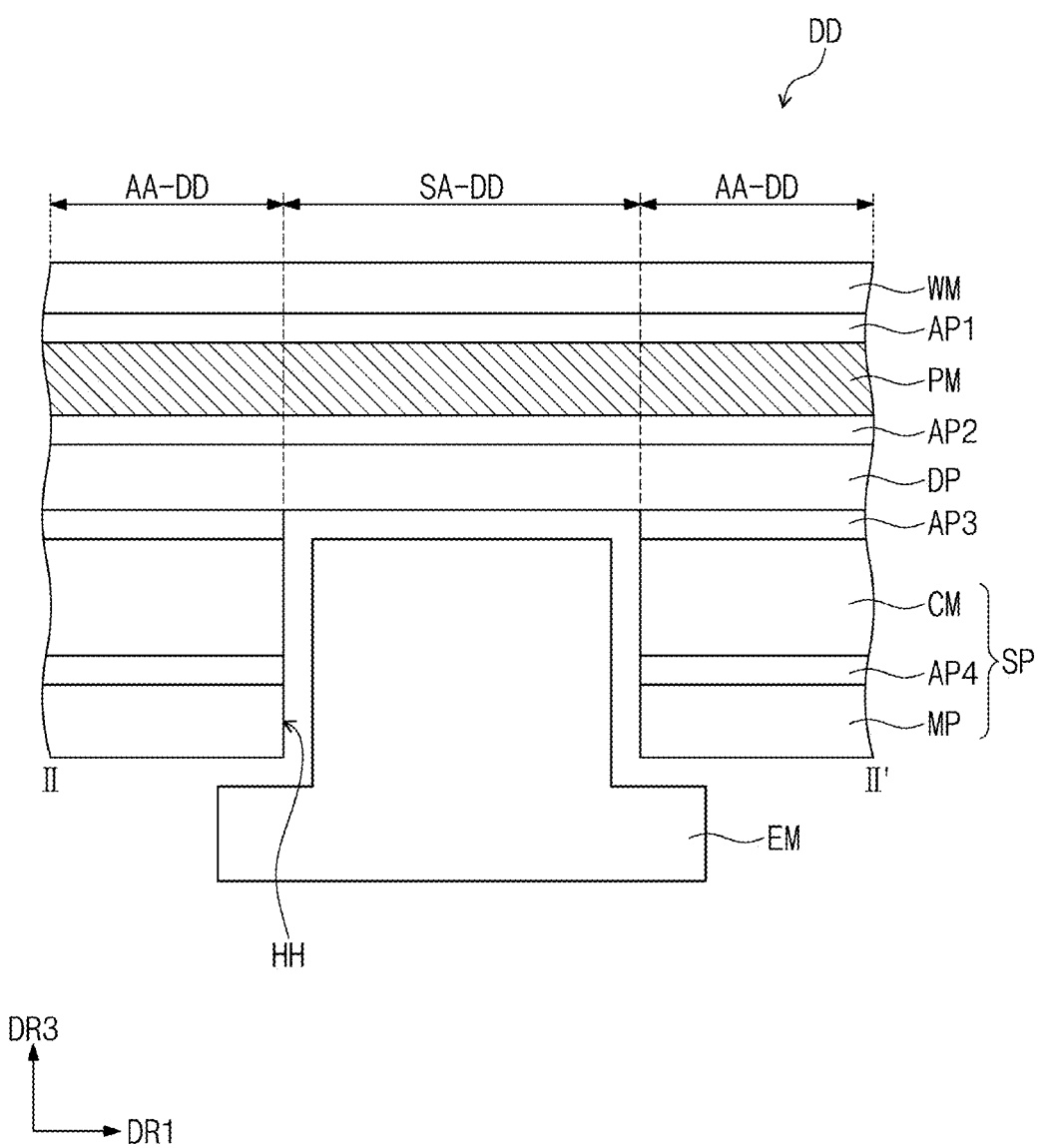
FIG. 4 is a cross-sectional view taken along line II-IF of FIG. 2.

FIG. 1 is a perspective view of an electronic apparatus in an embodiment. FIG. 2 is an exploded perspective view of an electronic apparatus according to an embodiment, and FIGS. 3 and 4 are each a cross-sectional view of an electronic apparatus according to an embodiment. FIG. 3 is a cross-sectional view taken along line I-I' of FIG. 2. FIG. 4 is a cross-sectional view taken along line II-IF of FIG. 2.

An electronic apparatus DD according to an embodiment may be an apparatus activated in response to an electric signal. For example, the electronic apparatus DD may be a portable phone, a tablet computer, a car navigation unit, a game machine, or a wearable device, but embodiments are not limited thereto. FIG. 1 exemplarily illustrates that the electronic apparatus DD is a portable phone.

The electronic apparatus DD may display an image IM through an active region AA-DD. The active region AA-DD may include a plane defined by a first direction axis DR1 and a second direction axis DR2. The active region AA-DD may further include a curved surface bent from at least one side of a plane defined by the first direction axis DR1 and the second direction axis DR2. The electronic apparatus DD according to an embodiment illustrated in FIG. 1 is illustrated to include two curved surfaces respectively bent from both side surfaces of the plane defined by the first direction axis DR1 and the second direction axis DR2. However, embodiments are not limited to the shape of the active region AA-DD. For example, the active region AA-DD may include only the plane, and the active region AA-DD may further include four curved surfaces respectively bent from at least two or more, for example, four sides of the plane.

Meanwhile, FIG. 1 and the drawings below illustrate the first direction axis DR1 to third direction axis DR3, and the directions indicated by the first, second, and third direction axes DR1, DR2 and DR3 described in the following descriptions are relative concepts and may be converted into other directions. In addition, the directions indicated by the first, second, and third direction axes DR1, DR2 and DR3 may be described as first, second, and third directions, and the same reference symbols may be used.

In the following descriptions, the first direction axis DR1 and the second direction DR2 are orthogonal to each other, and the third direction axis DR3 may be a normal line direction with respect to the plane defined by the first direction DR1 and the second direction DR2.

A sensing region SA-DD may be defined within the active region AA-DD of the electronic apparatus DD. FIG. 1 exemplarily illustrates a single sensing region SA-DD, but embodiments are not limited to the number of the sensing regions SA-DD. The sensing region SA-DD may be a portion of the active region AA-DD. Accordingly, the electronic apparatus DD may display an image through the sensing region SA-DD.

An electronic module EM may be disposed in a region overlapping the sensing region SA-DD. The electronic module EM may receive an external input transmitted through the sensing region SA-DD or provide an output through the sensing region SA-DD.

Referring to FIGS. 1, 2, 3, and 4, the electronic apparatus DD may include a display region DA and a non-display region NDA adjacent to the display region DA. The display region DA may be a portion corresponding to an active region AA of a display panel DP to be described later, and the non-display region NDA may be a portion corresponding to a peripheral region NAA of the display panel DP.

The non-display region NDA may be a region that blocks an optical signal, is disposed outside the display region DA, and surrounds the display region DA. In an embodiment, the non-display region NDA may not be disposed on the front surface, but may be disposed on a side surface of the electronic apparatus DD. In an embodiment, the electronic apparatus DD may not have the non-display region NDA.

The electronic apparatus DD according to an embodiment may include an electronic module EM, a display panel DP disposed on the electronic module EM, and a polarization plate PM disposed on the display panel DP. A support member SP may be disposed under the display panel DP, and a through-hole HH overlapping the electronic module EM may be defined in the support member SP.

The electronic apparatus DD according to an embodiment may include a window WM disposed on the display panel DP. In addition, the electronic apparatus DD according to an embodiment may include a housing HU disposed under the display panel DP. The electronic module EM, the display panel DP, and the like may be accommodated in the housing HU.

In the electronic apparatus DD according to an embodiment, the window WM and the housing HU may be coupled to constitute the outer appearance of the electronic apparatus DD. In the electronic apparatus DD according to an embodiment, the electronic module EM may be an electronic component that outputs or receives an optical signal. For example, the electronic module EM may be a camera module for capturing an external image. In addition, the electronic module EM may be a sensor module such as a proximity sensor or an infrared light-emitting sensor.

In an electronic apparatus DD according to an embodiment, the display panel DP may be disposed on the electronic module EM. The display panel DP may include an active region in which an image IM is displayed, and a peripheral region NAA adjacent to the active region AA. For example, the front surface IS of the display panel DP may include the active region AA and the peripheral region NAA. The active region AA may be a region which is activated in response to an electrical signal.

The peripheral region NAA may be adjacent to the active region AA. The peripheral region NAA may surround the active region AA. In the peripheral region NAA, a drive circuit or a drive line for driving the active region AA, various signal lines or pads for providing electrical signals to the active region AA, or the electronic elements.

The display panel DP may include a first display region NSA-EP and a second display region SA-EP. The second display region SA-EP may be a region overlapping the electronic module EM, and the first display region NSA-EP may be a region that is disposed to surround at least a portion of the second display region SA-EP. The second display region SA-EP may correspond to the sensing region SA-DD of the electronic apparatus DD. The first display region NSA-EP may be a portion corresponding to the active region AA-DD excluding the sensing region SA-DD in the electronic apparatus.

When viewed in a plane, the area of the second display region SA-EP may be smaller than the area of the first display region NSA-EP. The transmittance of the first display region NSA-EP and the second display region SA-EP may be different from each other. The transmittance of the second display region SA-EP may be greater than the transmittance of the first display region NSA-EP.

Meanwhile, in the display panel DP according to an embodiment, a portion of a drive circuit, a drive line, or the like for driving pixels PX (e.g., in FIG. 7) disposed in the second display region SA-EP may be disposed in the peripheral region NAA. Thus, the wiring density in the second display region SA-EP may be lower than the wiring density in the first display region NSA-EP. However, embodiments are not limited thereto, and the wiring density in the first display region NSA-EP may substantially be the same as the wiring density in the second display region SA-EP. The display panel DP may include a light-emitting element layer DP-ED (e.g., in FIG. 6) that includes an organic light-emitting element, a quantum dot light-emitting element, a micro LED light-emitting element, or a nano LED light-emitting element. The light-emitting element layer DP-ED (e.g., in FIG. 6) may be a configuration that actually generates an image.

In an electronic apparatus DD according to an embodiment, the polarization plate PM may be disposed on the display panel DP. The polarization plate PM may be disposed between the display panel DP and the window WM. In an embodiment, the polarization plate PM may include a polarizer layer (e.g., in FIG. 5A). The polarization plate PM may perform a reflection preventing function for reducing reflection due to light incident from the outside of the electronic apparatus DD.

The polarization plate PM may include a first polarization region NSA-P and a second polarization region SA-P. The second polarization region SA-P may be a portion overlapping the electronic module EM and a portion corresponding to the sensing region SA-DD of the electronic apparatus. The first polarization region NSA-P may be disposed to surround at least a portion of the second polarization region SA-P. The light transmittance in the first polarization region NSA-P may be lower than the average light transmittance in the second polarization region SA-P. For example, the average transmittance of the polarization plate PM may be about 50% or less in the first polarization region NSA-P. In addition, the average transmittance of the polarization plate PM may be about 50% or greater in the second polarization region SA-P. Specifically, the average light transmittance of the polarization plate PM may be about 70% or greater in the second polarization region SA-P.

The first polarization region NSA-P of the polarization plate PM may be a portion overlapping the first display region NSA-EP of the display panel DP, and the second polarization region SA-P may be a portion overlapping the second display region SA-EP of the display panel DP.

In the electronic apparatus DD according to an embodiment, the display panel DP and the polarization plate PM will be described in detail with reference to drawings.

Referring to FIGS. 2, 3, and 4 and the like, the support member SP may be disposed under the display panel DP. The support member SP may include a cushion layer CM and a metallic support layer MP. In addition, the support part SP may further include at least one of adhesive layers AP3 and AP4. The adhesive layers AP3 and AP4 may be optically clear adhesive layers.

A through-hole HH may be defined in the support member SP. The through-hole HH may be defined so as to pass through the cushion layer CM and the metallic support layer MP. In addition, the through-hole HH may be likewise defined passing through the adhesive layers AP3 and AP4 included in the support member SP.

The through-hole HH may be defined so as to be disposed in the active region AA of the display panel DP. In the electronic apparatus DD, the second display region SA-EP of the display panel DP may also be a portion corresponding to the through-hole HH. The second polarization region SA-P of the polarization plate PM may be a portion corresponding to the through-hole HH. The electronic module EM may overlap the through hole HH. At least a portion of the electronic module EM may be disposed to be inserted in the through-hole HH.

The cushion layer CM may be provided to protect the display panel DP and the electronic module EM from a physical shock applied from the outside of the electronic apparatus DD. In addition, the cushion layer CM may be provided in at least a predetermined thickness to implement the through hole HH. The thickness of the cushion layer CM may be about 50 µm or greater. For example, the thickness of the cushion layer CM may be about 100 µm or greater.

The cushion layer CM may be formed by including at least one among an acrylic-based polymer, a urethane-based polymer, a silicon-based polymer, or an imide-based polymer. The cushion layer CM may have a strength capable of protecting the display panel DP and the electronic module EM and define the through-hole HH.

An adhesive layer AP3 may be disposed on the cushion layer CM. The adhesive layer AP3 may couple the cushion layer CM and the display panel DP.

A metallic support layer MP may be a support substrate that supports members included in the electronic apparatus DD such as the display panel DP. The metallic support layer MP may be a thin-film metallic substrate. The metallic support layer MP may also have a function such as heat dissipation or electromagnetic wave shield.

In the electronic apparatus DD according to an embodiment, the support member SP may further include a panel support part. The panel support part may be disposed under the display panel DP. The panel support part may be disposed between the display panel DP and the cushion layer CM. The panel support part may include a polymer film. The polymer film may be an optically transparent polyethylene terephthalate (PET) film.

In addition, the support member SP may further include an adhesive layer that couples a panel support part and the display panel DP, and the adhesive layer may be an optically transparent adhesive layer.

In the electronic apparatus DD according to an embodiment, the window WM may be disposed on the polarization plate PM. The window WM may cover the front surface IS of the display panel DP. The window WM may include a base substrate WM-BS and a bezel pattern WM-BZ.

The base substrate WM-BS may be a substrate that includes an optically transparent insulating material. The base substrate WM-BS may have flexibility. For example, the base substrate WM-BS may include a polymer film, a substrate including a polymer material, or a thin-film glass substrate. The base substrate WM-BS may correspond to a substrate having no phase difference or a very low phase difference. On the base substrate WM-BS, functional layers such as a reflection preventing layer, a fingerprint preventing layer, or an optical layer for controlling phases may further be disposed.

The bezel pattern WM-BZ may be a color layer printed on one surface of the base substrate WM-BS or deposited on the base substrate WM-BS. For example, the bezel pattern WM-BZ may have a multilayer structure. The multilayer structure may include a colored layer and a black light-blocking layer. The colored layer and the black light-blocking layer may be formed through a deposition, printing, or coating process. The bezel pattern WM-BZ may be omitted, and may be formed on functional layers other than the base substrate WM-BS.

The window WM includes an upper surface FS exposed to the outside. The upper surface FS of the electronic apparatus DD may substantially be defined by the upper surface FS of the window WM. A transmissive region TA may be an optically transparent region on the upper surface FS of the window WM. The transmissive region TA may have a shape corresponding to the active region AA of the display panel DP. For example, the transmissive region TA overlaps the entirety of or at least a portion of the active region AA. The image displayed on the active region AA of the display panel DP may be viewed from the outside through the transmissive region TA.

On the upper surface FS of the window WM, a bezel region BZA may be a portion to which a bezel pattern WM-BZ is provided. The bezel region BZA may define the shape of the transmissive region TA. The bezel region BZA may be adjacent to the transmissive region TA and surround the transmissive region TA. The bezel region BZA may cover the peripheral region NAA of the display panel DP and prevent the peripheral region NAA from being viewed from the outside.

A sensing region SA may be defined in the transmissive region TA of the window WM. The sensing region SA of the window may be defined as the sensing region SA-DD of the electronic apparatus DD.

The display apparatus DD according to an embodiment may further include adhesive layers AP1 and AP2 disposed at least between the polarization plate PM and the window WM or between the display panel DP and the polarization plate PM. The adhesive layers AP1 and AP2 may be optically transparent adhesive layers.

Figure 5A:
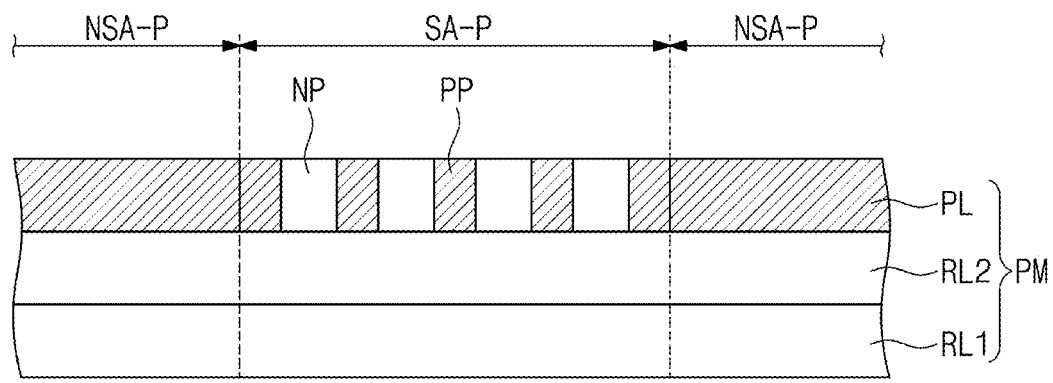
FIG. 5A is a cross-sectional view of a polarization plate of the electronic apparatus of FIG. 2.
Figure 5B:
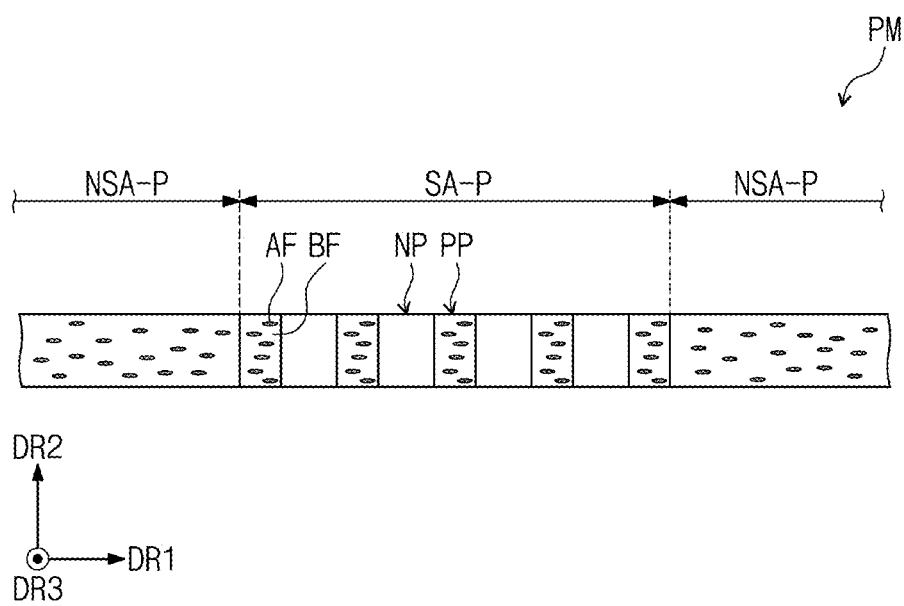
FIG. 5B is a plan view of the polarization plate of FIG. 5A.

FIG. 5A is a cross-sectional view of a polarization plate according to an embodiment, and FIG. 5B is a plan view of the polarization plate according to an embodiment. FIGS. 5A and 5B illustrate a portion of a second polarization region SA-P and a first polarization region NSA-P disposed to surround the second polarization region SA-P. The first polarization region NSA-P may be a portion overlapping the first display region NSA-EP of the display panel, and the second polarization region SA-P may be a portion overlapping the second display region SA-EP of the display panel.

The polarization plate PM according to an embodiment may include a polarizer layer PL. The polarizer layer PL may be included in the uppermost layer of the polarization plate PM. The polarizer layer PL may be the outermost layer and may constitute the upper surface of the polarization plate PM spaced apart from the display panel DP (e.g., in FIG. 4).

The polarizer layer PL may be an optical layer for linearly polarizing the provided light in one direction. For example, the polarizer layer PL may be a linear polarizing layer, but embodiments are not limited thereto. The polarizer layer PL may be a film-type linear polarizer including a stretched polymer film. For example, the stretched polymer film may be a stretched polyvinyl alcohol film.

The polarizer layer PL may include a stretched polymer film BF and light absorbers AF adsorbed to the polymer film BF. For example, the light absorbers AF may be attached to the outer surface of the polymer film BF. For example, the light absorbers may be dispersed in the polymer film BF. The polymer film BF may include polyvinyl alcohol. The light absorbers AF may be dichromic dye or iodine. For example, the polarizer layer PL may be manufactured by applying iodine to be adsorbed onto a stretched polyvinyl alcohol film. For example, the iodine may be dispersed in the stretched polyvinyl alcohol film.

At this point, the direction in which the polymer film BF is stretched (e.g., in the first direction DR1) may be an absorption axis of the polarizer layer PL, and a direction perpendicular to the stretching direction may be the transmission axis of the polarizer layer PL (e.g., in the third direction DR3). In an embodiment, the transmission axis of the polarization plate PM may be defined as the transmission axis of the polarizer layer PL. However, embodiments are not limited thereto, and the polarization direction may be changed by other optical function layers included in the polarization plate PM. In this case, the transmission axis of the polarization plate PM may not coincide with the transmission axis of the polarizer layer PL.

In addition, the polarization plate PM may further include at least one of phase retarding layers RL1 and RL2 which are disposed under the polarizer layer PL. The polarization plate PM may include a first phase retarding layer RL1 and a second phase retarding layer RL2. The second phase retarding layer RL2 may be disposed between the first phase retarding layer RL1 and the polarizer layer PL. The first phase retarding layer RL1 and the second phase retarding layer RL2 may each be an optical layer that retards the phase of the provided light. The first phase retarding layer RL1 may be a λ/4 phase retarder and the second phase retarding layer RL2 may be a λ/2 phase retarder.

For example, the polarization plate PM according to an embodiment may further include a light compensation layer, a protective layer, a support layer, an adhesive layer or the like.

The polarization plate PM according to an embodiment may include a polarization part PP and a non-polarization part NP in the second polarization region SA-P. In an embodiment, the non-polarization part NP may be a portion in which light absorbers AF are detached or removed from the polymer film BF of the polarizer layer PL, or a portion in which only a small amount of light absorbers AF is adsorbed onto the polymer film BF of the polarizer layer PL.

In an embodiment, the number of light absorbers AF per unit area (e.g., in a plan view) in the non-polarization part NP may be smaller than the number of the light absorbers AF per unit area (e.g., in a plan view) in the polarization part PP. In addition, the number of the light absorbers AF per unit area (e.g., in a plan view) in the first polarization region NSA-P may be more than the average number of the light absorbers AF per unit area (e.g., in a plan view) in the second polarization region SA-P.

In an embodiment, the non-polarization part NP is a portion that does not have a linear polarization function in the polarizer layer PL, and the polarization part PP corresponds to a portion, in which the linear polarization function is maintained, in the polarizer layer PL. In addition, the first polarization region NSA-P also corresponds to a portion, in which the linear polarization function is maintained like the polarization part PP.

In an embodiment, the light transmittance of the non-polarization part NP may be greater than the light transmittance of the polarization part PP. In addition, the light transmittance of the non-polarization part NP may be greater than the light transmittance of the first polarization region NSA-P. The average light transmittance of the second polarization region SA-P may be the average light transmittance value of the polarization part PP and the non-polarization part NP. Thus, the average light transmittance of the second polarization region SA-P may be greater than the average light transmittance of the first polarization region NSA-P.

Figure 6:
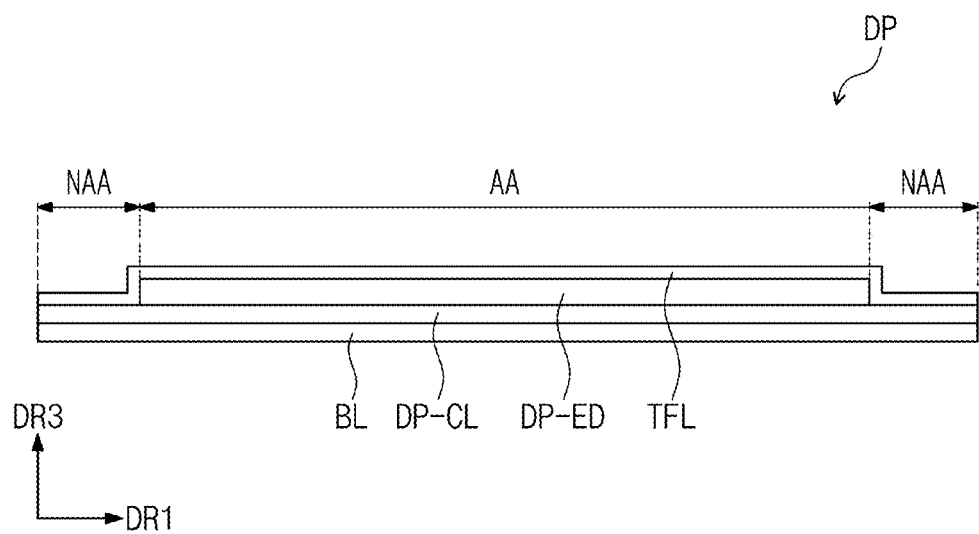
FIG. 6 is a cross-sectional view of a display panel of the electronic apparatus of FIG. 2.
Figure 7:
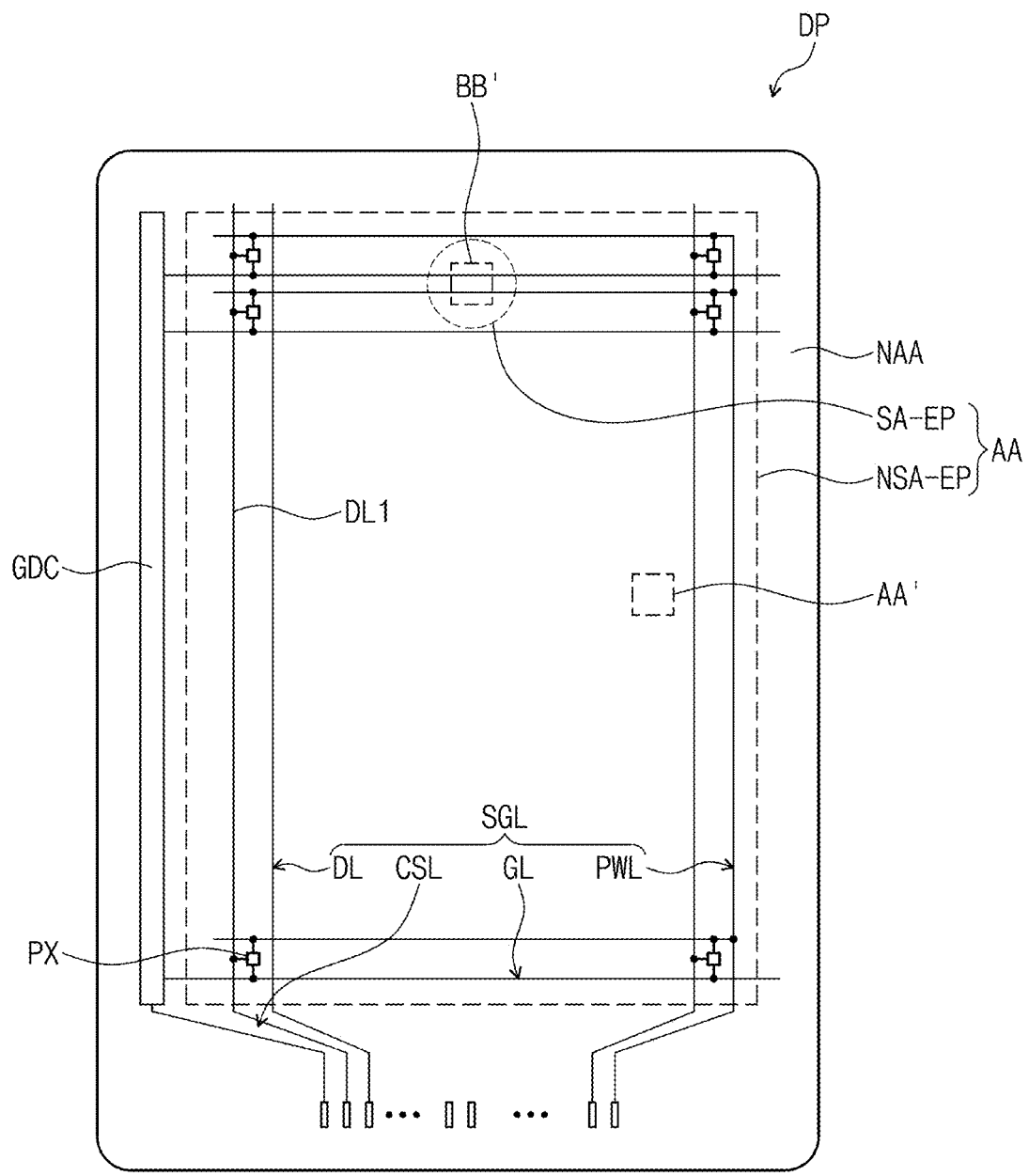
FIG. 7 is a plan view of the display panel of FIG. 6.

FIG. 6 is a cross-sectional view of a display panel according to an embodiment, and FIG. 7 is a plan view of the display panel according to an embodiment.

In an embodiment, a display panel DP includes a base layer BL, a circuit layer DP-CL disposed on the base layer BL, a light-emitting element layer DP-ED, and an upper insulating layer TFL. The base layer BL may include a plastic substrate, a glass substrate, a metal substrate, an organic/inorganic composite material substrate, or the like. For example, the base layer BL may include at least one polyimide layer.

The circuit layer DP-CL may include at least one insulating layer, semiconductor patterns, and conductive patterns. The insulating layer may include at least one inorganic layer and at least one organic layer. The semiconductor patterns and the conductive patterns may constitute signal lines, a pixel drive circuit, and a scan drive circuit. This will be described later in detail.

Figure 12:
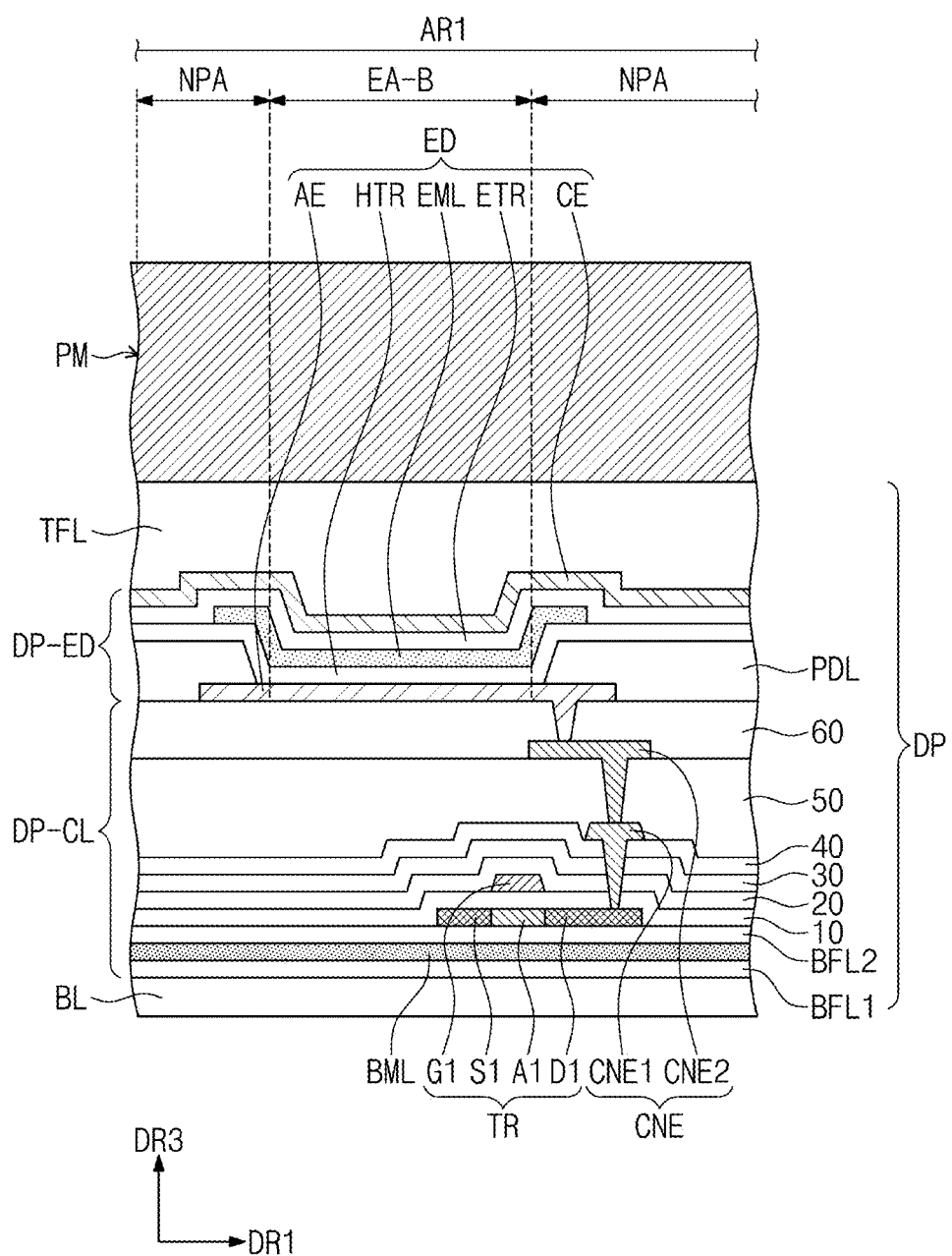
FIG. 12 is a cross-sectional view of an embodiment of the display panel and the polarization plate of the electronic apparatus of FIG. 2.

The light-emitting element layer DP-ED includes a display element, for example, a light-emitting element ED (e.g., in FIG. 12). The light-emitting element layer DP-ED may further include an organic layer such as a pixel defining layer PDL (e.g., in FIG. 12).

The light-emitting element layer DP-ED may be disposed in an active region AA. A peripheral region NAA is disposed on the outer periphery of the active region AA and surrounds the active region AA, and light-emitting elements may not be disposed in the peripheral region NAA.

The upper insulating layer TFL may include a plurality of thin films. Some thin films are disposed to improve optical efficiency, and some thin films are disposed to protect light-emitting elements. The upper insulating layer TFL may include a thin film encapsulating layer including a laminated structure of inorganic layer/organic layer/inorganic layer.

Meanwhile, the display panel DP may further include a sensor layer. The sensor layer may detect an external input applied from the outside. The external input may be user's input. The user's input may mean various-type external inputs such as a portion of a user's body, light, heat, a pen, or a pressure.

The sensor layer may be formed on the upper insulating layer TFL through a continuous process. In this case, the sensor layer may be expressed to be directly disposed on the upper insulating layer TFL. The wording "directly disposed" may mean that other components are not disposed between the sensor layer and the upper insulating layer TFL. For example, a separate adhesive member may not be disposed between the sensor layer and the upper insulating layer TFL. Meanwhile, embodiments are not limited thereto, and an adhesive member may further be disposed between the sensor layer and the upper insulating layer TFL. Meanwhile, in an embodiment, the sensor layer may include a sensing electrode for detecting an external input, and the sensing electrode may be formed by including transparent metal oxides or the like.

As illustrated in FIG. 7, the display panel DP may include a plurality of signal lines SGL (hereinafter, referred to as signal lines), a plurality of pixels PX (hereinafter, referred to as pixels), and a drive circuit GDC. Pixels PX are disposed in an active region AA. Each of the pixels PX includes a light-emitting element and a pixel drive circuit connected thereto. The signal lines SGL and the pixel drive circuit may be included in the circuit layer DP-CL illustrated in FIG. 6.

The second display region SA-EP may be a portion having a lower pixel density than the first display region NSA-EP, or a portion having a lower wiring density.

For example, in the display apparatus according to an embodiment, a smaller number of pixels PX may be disposed in the second display region SA-EP than in the first display region NSA-EP with respect to the same unit area. A region in which pixels PX are not disposed corresponds to a region through which an optical signal transmits. However, embodiments are not limited thereto, and the second display region SA-EP may have substantially the same level of pixel density as the first display region NSA-EP.

Meanwhile, when the pixel densities in the second display region SA-EP and the first display region NSA-EP are substantially the same, the wiring density of the second display region SA-EP may be lower than the wiring density of the first display region NSA-EP. For example, circuit wiring such as a transistor TR (e.g., in FIG. 13) for driving a second pixel unit AR1' (e.g., in FIG. 13) disposed in the second display region SA-EP may be disposed to be moved to the peripheral region NAA. Thus, the wiring density in the second display region SA-EP may be lower than the wiring density in the first display region NSA-EP. The pixels PX are not disposed in the peripheral region NAA. The drive circuit GDC is disposed in the peripheral region NAA. In this embodiment, the drive circuit GDC may include a scan drive circuit. The scan drive circuit generates a plurality of scan signals (hereinafter, referred to as scan lines) and sequentially outputs the scan signals to a plurality of scan lines GL (hereinafter, referred to as scan lines). The scan drive circuit may further output another different control signal to the drive circuit for the pixels PX.

The scan drive circuit may include a plurality of thin film transistors which are formed through the same process as, for example, a low-temperature polycrystalline silicon (LTPS) process or a low-temperature polycrystalline oxide (LTPO) process, by which the drive circuit for the pixels PX is formed.

The signal lines SGL include scan lines GL, data lines DL, a power line PWL and a control signal line CSL. The signal lines SGL may further include separate reset lines and light-emitting lines. The scan lines GL are respectively connected to the corresponding pixels PX among the pixels PX, and the data lines DL are respectively connected to the corresponding pixels PX among the pixels PX. The power line PWL is connected to the pixels PX. The control signal line CSL may provide the scan drive circuit with control signals.

The signal lines SGL may be connected to a circuit board. The signal lines SGL may be connected to a timing control circuit having a shape of an integrated circuit mounted on the circuit board.

In an embodiment, the signal lines SGL may be disposed on the circuit layer DP-CL, and may be referred to as at least one metal pattern MTL (e.g., in FIG. 15) included in at least one circuit layer DP-CL among the signal lines SGL. For example, the scan lines GL and the data lines DL among the signal lines SGL may be metal patterns MTL (e.g., in FIG. 15) that do not overlap a non-polarization part NP (e.g., in FIG. 15) of a polarization plate.

Figure 8:
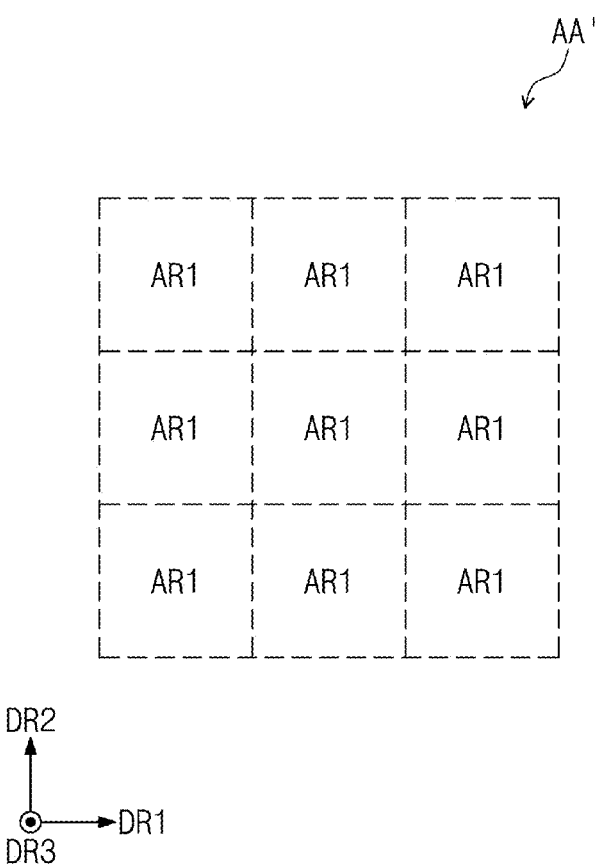
FIG. 8 is a plan view of region AA' of FIG. 7.
Figure 9:
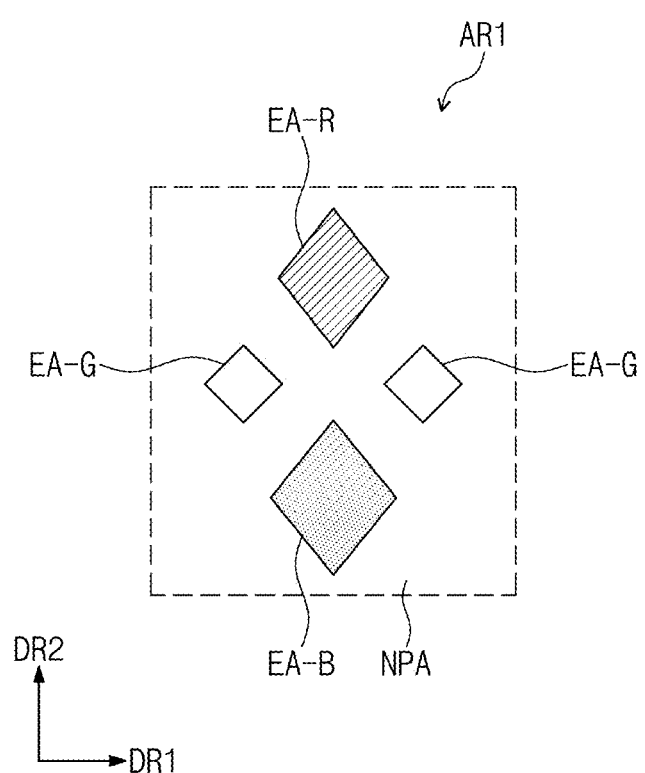
FIG. 9 is a plan view of a pixel unit of the display panel of the electronic apparatus of FIG. 2.

FIG. 8 is a plan view illustrating region AA' of FIG. 7. FIG. 8 simplifies and illustrates the pixel units disposed in region AA' of FIG. 7. FIG. 9 is a plan view illustrating the configuration of light-emitting regions included in the one pixel unit illustrated in FIG. 8.

Pixels may be disposed in first pixel units AR1 and the first pixel units AR1 may be regions to which an image is provided. Thus, the first pixel units AR1 may be referred to as effective regions or image regions.

Referring to FIGS. 7, 8, and 9, the plurality of first pixel units AR1 disposed in the first display region NSA-EP may have disposition of mutually the same light-emitting regions EA-B, EA-G, and EA-R. The first light-emitting region EA-B is an emission region of a first color pixel, the second light-emitting region EA-G is an emission region of a second color pixel, and the third light-emitting region EA-R is an emission region of a third color pixel.

Each of the plurality of first pixel units AR1 may include the first light-emitting region EA-B, the second light-emitting region EA-G, and the third light-emitting region EA-R. In this embodiment, it is illustrated that each of the plurality of first pixel units AR1 include a single first light-emitting region EA-B, two second light-emitting regions EA-G, and a single third light-emitting region EA-R. However, embodiments are not limited thereto.

In addition, it is illustrated that the shape of each of the light-emitting regions EA-B, EA-G and EA-R included in the first pixel unit AR1 has a diamond shape when viewed in a plane, but embodiments are not limited thereto.

Referring to FIG. 9, in a single pixel unit AR1, the two second light-emitting regions EA-G may be disposed spaced apart from each other in the direction of the first direction axis DR1, and the first light-emitting region EA-B and the third light-emitting region EA-R may be disposed spaced apart from each other with the second light-emitting regions EA-G therebetween. The light-emitting regions EA-B, EA-G and EA-R may be distinguished from each other by a non-light-emitting region NPA. The light-emitting regions EA-B, EA-G and EA-R may be regions divided by a pixel defining layer PDL (e.g., in FIG. 12), and the non-light-emitting region NPA may be a region overlapping the pixel defining layer PDL (e.g., in FIG. 12).

In an embodiment, one among the second light-emitting regions EA-G included in the first pixel unit AR1 may also be defined as a fourth light-emitting region distinguished from the second light-emitting region EA-G. FIG. 9 illustrates that the two second light-emitting regions EA-G have the same shape and the same area when viewed in a plane, but embodiments are not limited thereto. Unlike those illustrated, in an embodiment, the second light-emitting region EA-G and the fourth light-emitting region may have different shapes from each other when viewed in a plane.

In an embodiment, the configuration of the first pixel units AR1 included in the first display region NSA-EP is not limited to that illustrated in the drawing, but the number of light-emitting regions included in the single first pixel unit AR1, the ratio between the different light-emitting regions, the disposition relationship between the light-emitting regions, the shapes of the light-emitting regions, and the like may be changed and combined according to display quality required by a display panel DP.

In an embodiment, a single first light-emitting region EA-B may generate a blue light. Each of the two second light-emitting regions EA-G may each generate a green light. The one third light-emitting regions EA-R may each generate a red light. The blue light, the green light, and the red light may be changed into other three primary color lights.

Figure 10:
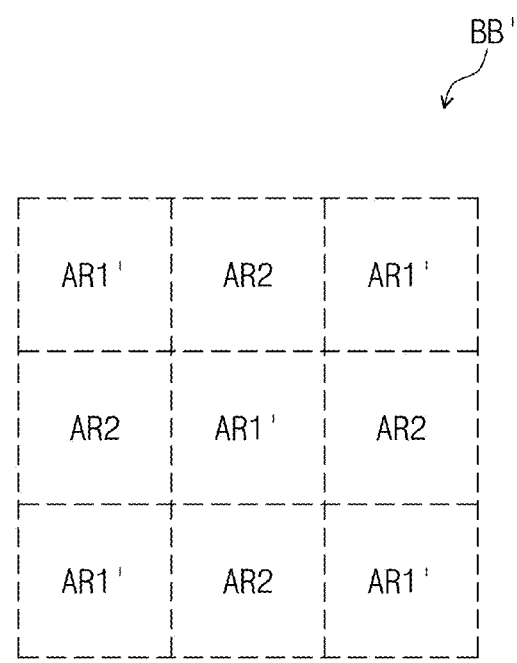
FIG. 10 is a plan view of region BB' of FIG. 7.
Figure 11:
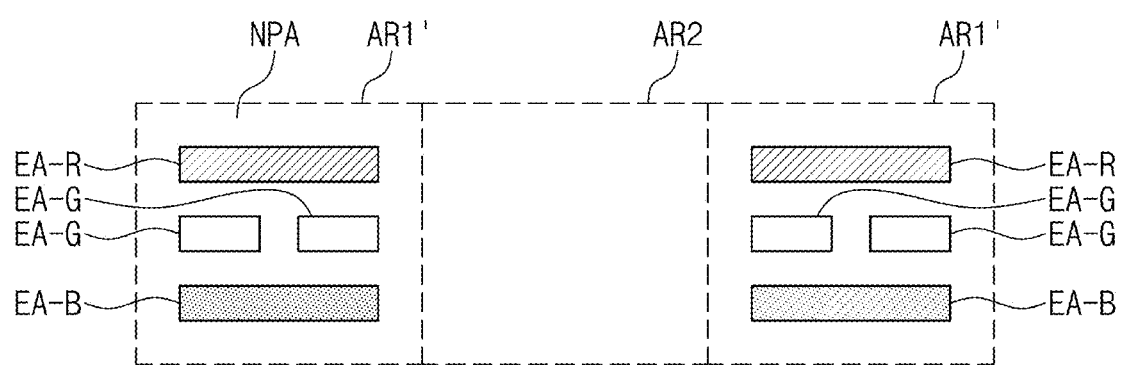
FIG. 11 is a plan view of a pixel unit and non-pixel unit of FIG. 10.

FIG. 10 is a plan view illustrating region BB' of FIG. 7. FIG. 10 simplifies and illustrates the pixel units disposed in region BB' of FIG. 7. FIG. 11 is a plan view illustrating a portion of region BB' illustrated in FIG. 10.

FIG. 10 is a plan view illustrated in region BB' which is a portion of the second display region SA-EP of the display panel DP illustrated in FIG. 7. The second display region SA-EP may include a plurality of second pixel units AR1' and a plurality of non-pixel units AR2.

Referring to FIGS. 7, 8, 9, and 11, the second display region SA-EP may include the second pixel units AR1' and the non-pixel unit AR2 which are alternately and repeatedly disposed. The plurality of second pixel units AR1' and the plurality of non-pixel units AR2 may be aligned according to a predetermined rule.

Pixels may be disposed in the second pixel units AR1' and the second pixel units AR1' may be regions to which an image is provided. Thus, the second pixel units AR1' may be referred to as effective regions or image regions.

The light transmittance of the non-pixel units AR2 may be greater than that of the second pixel units AR1'. The non-pixel units AR2 may be referred to as transmissive parts, non-display parts, semi-transmissive parts, transmissive regions, non-pixel regions, openings, open regions or the like.

Pixels may not be disposed in the non-pixel units AR2. Light-emitting elements may not be disposed at least in the non-pixel units AR2. Accordingly, the resolution of the second display region SA-EP including the second pixel units AR1' and the non-pixel units AR2 may be lower than the resolution of the first display region NSA-EP.

Semiconductor patterns, conductive patterns, or signal lines may not be disposed in the non-pixel units AR2. In addition, reflective electrodes, non-transmissive electrodes or the like may not be disposed in the non-pixel units AR2. In addition, in the non-pixel units AR2, an optical signal may move through the non-pixel units AR2. For example, a signal provided from an electronic module (e.g., in FIG. 4) may be output, or a signal input from the outside may be received through the non-pixel units AR2.

Referring to FIG. 10, the second pixel units AR1' and the non-pixel units AR2 may alternately be arranged along the first direction axis DR1 and the second direction axis DR2. For example, a single second pixel unit AR1' and a single non-pixel unit AR2 may alternately be arranged. The non-pixel unit AR2 may have an area corresponding to the area of the second pixel unit AR1'. However, embodiments are not limited thereto, and the non-pixel unit AR2 does not necessarily have the same area as the second pixel unit AR1'.

In addition, the arrangement of the second pixel units AR1' and the non-pixel units AR2 is not limited to that illustrated in FIG. 10. In the second display region SA-EP, the ratio between the numbers of the second pixel units AR1' and the non-pixel units AR2 may be different from that illustrated in FIG. 10. In an embodiment, the non-pixel units AR2 may be aligned in a stripe shape along the first direction axis DR1 or the second direction axis DR2, or the numbers of the second pixel units AR1 and the non-pixel units AR2 may be varied (e.g., in the region BB' illustrated in FIG. 10).

FIG. 11 is a plan view for more specifically illustrating the configuration of the second pixel units AR1' and the non-pixel unit AR2 in a second display region SA-EP. In an embodiment, the non-pixel unit AR2 may be disposed between the second pixel units AR1'.

The second pixel units AR1' may include at least three light-emitting regions EA-B, EA-G, and EA-R as illustrated. The second pixel units AR1' may include a first light-emitting region EA-B, a second light-emitting region EA-G, and a third light-emitting region EA-R. In this embodiment, it is illustrated that each of the plurality of second pixel units AR1' includes a single first light-emitting region EA-B, two second light-emitting regions EA-G, and a single third light-emitting region EA-R. However, embodiments are not limited thereto.

In addition, it is illustrated that the shape of each of the light-emitting regions EA-B, EA-G and EA-R included in the second pixel unit AR1' has a rectangular shape when viewed in a plane, but embodiments are not limited thereto.

Referring to FIG. 11, in a single second pixel unit AR1', the two second light-emitting regions EA-G may be disposed spaced apart from each other, and the first light-emitting region EA-B and the third light-emitting region EA-R may be disposed spaced apart from each other with the second light-emitting regions EA-G therebetween. The light-emitting regions EA-B, EA-G and EA-R may be distinguished from each other by a non-light-emitting region NPA. When the second pixel units AR1' include at least three light-emitting regions EA-B, EA-G and EA-R, the non-pixel unit AR2 may have an area greater than the sum of at least two light-emitting regions among the three light-emitting regions EA-B, EA-G and EA-R.

Referring to FIGS. 9 and 11, the arranged shapes and the shapes of the light-emitting regions in the first pixel unit AR1 and the second pixel units AR1' may be different from each other. Meanwhile, the sizes of the light-emitting regions included in the first pixel unit AR1 and the second pixel units AR1', the arrangement of the light-emitting regions, the area ratio between the mutually different light-emitting regions, the shapes of the light-emitting regions, or the like are not limited to those illustrated in FIGS. 9 and 11.

In addition, unlike illustrated, the first pixel unit AR1 and the second pixel unit AR1' may have the same configuration of light-emitting regions.

In an embodiment, the size of the second pixel unit AR1' may be different from the size of the first pixel unit AR1. For example, the size of the second pixel unit AR1' may be greater than the size of the first pixel unit AR1.

Region AA' illustrated in FIG. 8 and region BB' illustrated in FIG. 10 may illustrate the regions of the same unit area. Referring to FIGS. 7, 8, 9, and 10, the number of light-emitting regions per unit area (e.g., the region BB') in the second display region SA-EP may be smaller than the number of light-emitting regions per unit area AA' in the first display region NSA-EP. The number of pixel units AR1' disposed per unit area (e.g., in a plan view) in the second display region SA-EP may be smaller than the number of pixel units AR1 disposed per unit area (e.g., in a plan view) in the first display region NSA-EP. In addition, the pixel density in the second display region SA-EP may be lower than the pixel density in the first display region NSA-EP. However, embodiments are not limited thereto, and the pixel density in the second display region SA-EP and the pixel density in the first display region NSA-EP are substantially the same, and the wiring density in the second display region SA-EP may be lower than the wiring density in the first display region NSA-EP.

Figure 13:
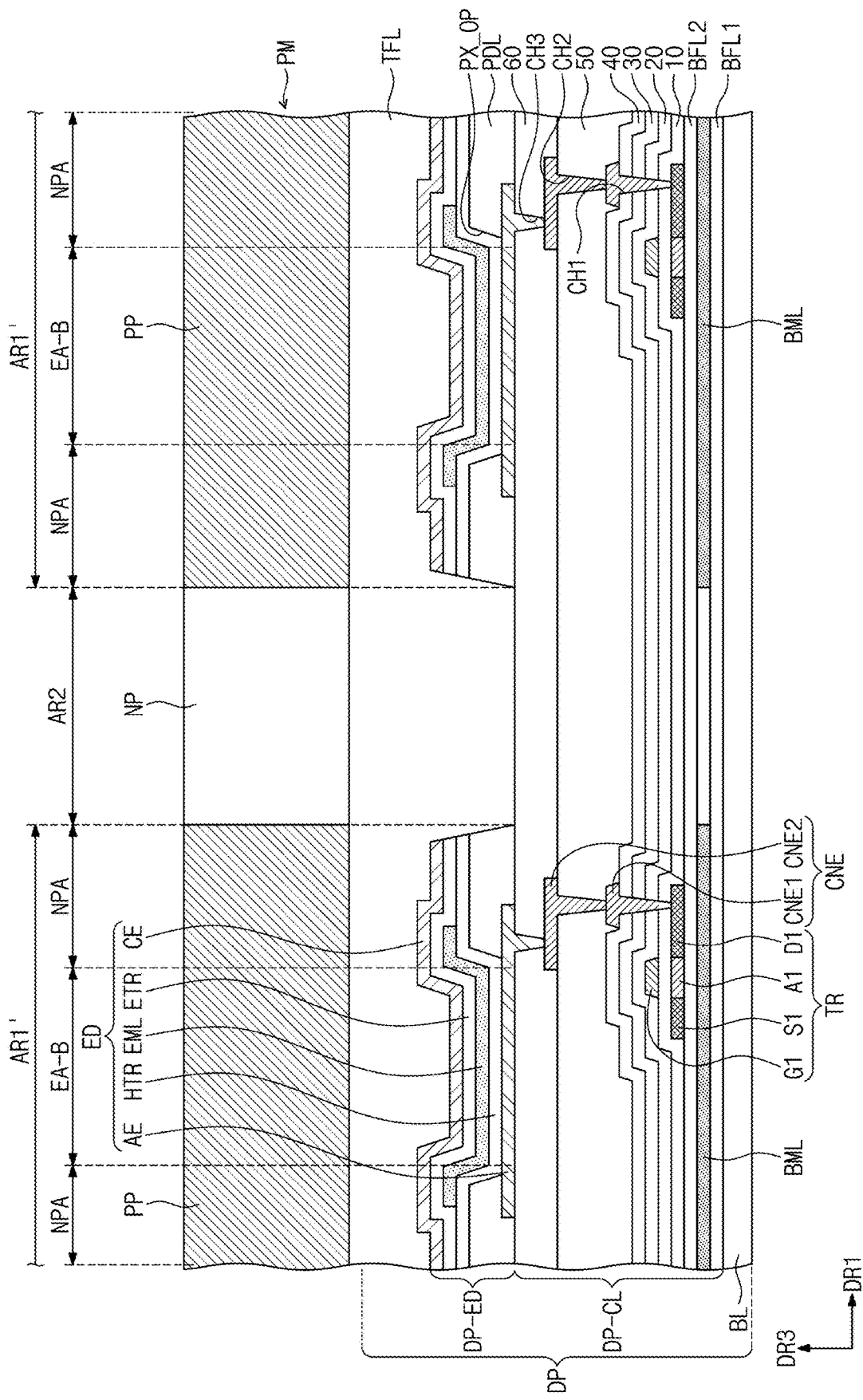
FIG. 13 is a cross-sectional view of another embodiment of the display panel and the polarization plate of the electronic apparatus of FIG. 2.

FIGS. 12 and 13 are each a cross-sectional view of an electronic apparatus according to an embodiment. FIG. 12 is a cross-sectional view of a portion of a first display region, and FIG. 13 is a cross-sectional view of a portion of a second display region.

FIG. 12 is a cross-sectional view illustrating a portion of an electronic apparatus corresponding to a first light-emitting region EA-B included in the first pixel unit AR1 illustrated in FIG. 8. FIG. 13 is a cross-sectional view illustrating a portion of an electronic apparatus, the portion corresponding to the first light-emitting regions EA-B included in the second pixel units AR1' and the non-pixel unit AR2 disposed between the second pixel units AR1'.

Referring to FIGS. 12 and 13, an electronic apparatus according to an embodiment may include a display panel DP and a polarization plate PM disposed on the display panel DP. As illustrated in FIGS. 12 and 13, an adhesive layer AP2 (e.g., in FIG. 4) disposed between the display panel DP and the polarization plate PM may be omitted.

Referring to FIGS. 12 and 13, the display panel DP may include a plurality of insulating layers, semiconductor patterns, conductive patterns, signal lines, and the like. The insulating layers, the semiconductor layers, the conductive layers and the like are formed through a method such as a coating process or a deposition process. Next, the insulating layers, the semiconductor layers, and the conductive layers may be selectively patterned through a photolithography method. Through such a method, a semiconductor pattern, a conductive pattern, signal lines and the like, which are included in a circuit layer DP-CL and a light-emitting element layer DP-ED, are formed. Next, an upper insulating layer TFL that covers the light-emitting element layer DP-ED may be formed.

A transistor TR and a light-emitting element ED may be disposed on a base layer BL. The light-emitting element ED may include a first electrode AE, a second electrode CE, and an emission layer EML disposed between the first electrode AE and the second electrode CE. In addition, the light-emitting element ED may include a hole transport region HTR disposed between the first electrode AE and the emission layer EML, and an electron transport region ETR disposed between the emission layer EML and the second electrode CE.

A first buffer layer BFL1 may be disposed on the base layer BL. The first buffer layer BFL1 may improve the coupling strength between the base layer BL and a metal pattern such as a lower shield pattern BML. The first buffer layer BFL1 may include at least one among a silicon oxide layer or a silicon nitride layer. For example, the first buffer layer BFL1 may be formed by alternately stacking or laminating the silicon oxide layer and the silicon nitride layer.

A lower shield pattern BML may be disposed on the first buffer layer BFL1. Meanwhile, in an embodiment, the first buffer layer BFL1 may be omitted, and in this case, the lower shield pattern BML may be provided on the upper surface of the base layer BL.

The lower shield pattern BML may overlap the transistor TR. The lower shield pattern BML may overlap active part A1 and function as a protective layer that prevents the degradation in electrical characteristics of the active part A1. In addition, in the manufacturing process of an electronic apparatus, the lower shield pattern may protect the transistor TR from laser light or moisture infiltrating or permeating from under the base layer BL. The lower shield pattern BML may be formed of a conductive material having a low light transmittance. For example, the lower shield pattern BML may block a laser beam of about 340 nm to about 810 nm.

The second buffer layer BFL2 may be disposed on the lower shield pattern BML. The second buffer layer BFL2 may cover the entirety of the lower shield pattern BML. A semiconductor pattern is disposed on the second buffer layer BFL2. The semiconductor pattern may include silicon semiconductor. The semiconductor pattern may also include polysilicon or amorphous silicon. In addition, the semiconductor pattern may also include a metal oxide semiconductor.

The semiconductor pattern may have electrical properties varying according to whether the semiconductor pattern is doped or not. The semiconductor pattern may include a doping region and a non-doping region. The doping region may be doped with N-type dopants or P-type dopants. A P-type transistor includes a doping region doped with a P-type dopant.

The doping region has greater conductivity than the non-doping region and may function as an electrode or a signal line. The non-doping region may substantially correspond to an active layer (e.g., a channel) of the transistor. In other words, a portion of the semiconductor pattern may be an active layer (e.g., channel) of the transistor, and another portion may be a source (e.g., an input electrode region), or a drain (e.g., an output electrode region), and still another portion may be a connection signal line (e.g., a connection electrode).

As illustrated in FIGS. 12 and 13, a source S1, an active layer A1, a drain D1 of the transistor TR are formed from a semiconductor pattern. A first insulating layer 10 may be disposed on the semiconductor pattern. A gate G1 of the transistor TR may be disposed on the first insulating layer 10. A second insulating layer 20 may be disposed on the gate G1. A third insulating layer 30 may be disposed on the second insulating layer 20.

The connection electrode CNE may be disposed between the transistor TR and a light-emitting element ED and connect the transistor TR and the light-emitting element ED. The connection electrode CNE may include a first connection electrode CNE1 and a second connection electrode CNE2.

The first connection electrode CNE1 may be disposed on the third insulating layer 30, and connected to the drain D1 through a first contact hole CH1 defined in the first, second, and third insulating layers 10, 20 and 30. A fourth insulating layer 40 may be disposed on the first connection electrode CNE1. A fifth insulating layer 50 may be disposed on the fourth insulating layer 40.

The second connection electrode CNE2 may be disposed on the fifth insulating layer 50. The second connection electrode CNE2 may be connected to the first connection electrode CNE1 through a second contact hole CH2 defined in the fifth insulating layer 50. A sixth insulating layer 60 may be disposed on the second connection electrode CNE2. The layers from the first buffer layer BFL1 to the sixth insulating layer 60 may be defined as a circuit layer DP-CL. The circuit layer DP-CL may include at least one metal pattern MTL (e.g., in FIG. 15) such as a lower shield pattern BML, the semiconductor patterns S1, A1 and D1, the gate G1 or the connection electrodes CNE. Such at least one metal pattern may not be included in a non-pixel unit AR2. The non-pixel unit AR2 may not include a semiconductor pattern or a conductive pattern, but include a plurality of insulating layers. The non-pixel unit AR2 may correspond to a transmissive region having a greater light transmittance than the pixel units AR1 and AR1'. In the electronic apparatus according to an embodiment, a portion corresponding to the non-pixel unit AR2 may be referred to as a non-pixel region, and a portion corresponding to the pixel units AR1 and AR1' may be referred to as pixel regions.

Unlike illustrated in FIG. 13, in an embodiment, circuit wiring such as the transistor TR disposed on the second pixel unit AR1' may not be disposed on the second pixel unit AR1', but disposed in a peripheral region NAA (e.g., in FIG. 7) of a display panel. For example, in an embodiment, unlike the first pixel unit AR1, the number of circuit lines such as the transistor TR disposed on the second pixel unit AR1' decreases, and accordingly, the wiring density in the second pixel unit AR1' may be lower than the wiring density in the first pixel unit AR1. Meanwhile, the circuit layer DP-CL in the second pixel unit AR1 may include transparent conductive layers, and the circuit lines disposed on the light-emitting element ED and the peripheral region NAA (e.g., in FIG. 7) may be electrically connected.

A first electrode AE may be disposed on the sixth insulating layer 60. The first electrode AE may be an anode electrode. The first electrode AE may be connected to the second connection electrode CNE2 through a third contact hole CH3 defined in the sixth insulating layer 60. A pixel defining layer PDL may be disposed on the first electrode AE and the sixth insulating layer 60. In the pixel defining layer PDL, an opening PX_OP for exposing a predetermined portion of the first electrode AE may be defined.

The pixel defining layer PDL may be formed of a polymer resin. For example, the pixel defining layer PDL may be formed with a polyacrylate-based resin or a polyimide-based resin. Furthermore, the pixel defining layer PDL may be formed to further include an inorganic material aside from the polymer resin. Meanwhile, the pixel defining layer PDL may be formed with a light absorbing material or include a black pigment or a black dye. The pixel defining layer PDL formed with a black pigment or a black dye may define a black pixel defining layer. When the pixel defining film layer is formed, carbon black etc. may be used as the black pigment or the black dye, but embodiments are not limited thereto.

When the pixel defining layer PDL is formed with a light absorbing material, the pixel defining layer PDL may block the laser light etc. incident from under the display panel DP. For example, the pixel defining layer PDL formed with a light absorbing material may block a laser beam of about 340 nm to about 810 nm. The pixel defining layer PDL may not be included in the non-pixel unit AR2. The pixel defining layer PDL may overlap a polarization part PP of the polarization plate PM and may not overlap a non-polarization part NP.

A hole transport region HTR may be disposed on the first electrode AE and on the pixel defining layer PDL. The hole transport region HTR may be commonly disposed in a light-emitting region EA-B and a non-light-emitting region NPA. The hole transport region HTR may include a hole transport layer and a hole injection layer.

The emission layer EML may be disposed on the hole transport region HTR. The emission layer EML may be disposed on a region corresponding to an opening PX_OP. The emission layer EML may include an organic material and/or an inorganic material. In FIGS. 12 and 13, the emission layer EML may be a portion that emits a blue light. Meanwhile, a second light-emitting region EA-G (e.g., in FIG. 9) may generate a green light, and a third light-emitting region EA-R (e.g., in FIG. 9) may generate a red light. The second light-emitting region EA-G (e.g., in FIG. 9) and the third light-emitting region EA-R (e.g., in FIG. 9) may also have a laminated structure corresponding to the first light-emitting region EA-B illustrated in FIGS. 12 and 13.

An electron transport region ETR may be disposed on the emission layer EML and the hole transport region HTR. The electron transport region ETR may be commonly disposed in the light-emitting region EA-B and the non-light-emitting region NPA. The electron transport region ETR may include an electron transport layer and an electron injection layer.

The second electrode CE may be disposed on the electron transport region ETR. The second electrode CE may be a cathode electrode. The second electrode CE may be provided as a common layer.

Meanwhile, in an embodiment, the hole transport region HTR, the electron transport region ETR, and the second electrode CE are illustrated extending up to the non-light-emitting region NPA, but embodiments are not limited thereto. For example, the hole transport region HTR, the electron transport region ETR, and the second electrode CE may also be patterned and provided so as to correspond to the light-emitting region.

The layer on which a light-emitting element ED is disposed may be defined as a light-emitting element layer DP-ED. An upper insulating layer TFL may be disposed on the light-emitting element ED.

The first electrode AE may not be included in the non-pixel unit AR2. The non-pixel unit AR2 may overlap the upper insulating layer TFL. In addition, when the second electrode CE is a transparent electrode, the non-pixel unit AR2 may include at least a portion of the second electrode CE.

The first electrode AE may be a reflective electrode with low transmittance or a semi-transmissive electrode. In the manufacturing process for an electronic apparatus, the first electrode AE may protect the emission layer EML and the like from laser light or moisture infiltrating or permeating from under the base layer BL. For example, the first electrode AE may block laser light with about 340 nm to about 810 nm.

The light transmittance of the polarization plate PM may be lower in a portion overlapping the pixel units AR1 and AR1' of the display panel DP than the light transmittance of the polarization plate PM overlapping the non-pixel unit AR2. The pixel units AR1 and AR1' are portions including the light-emitting region EA-B and the non-light-emitting region NPA, and the polarization plate PM overlapping the pixel units AR1 and AR1' may overlap at least one among a lower shield pattern of the circuit layer DP-CL, the transistor TR, the first electrode AE of the light-emitting element layer DP-ED, or the pixel defining layer PDL. In addition, the non-polarization part NP of the polarization plate PM overlapping the non-pixel unit AR2 may not overlap the lower shield pattern of the circuit layer DP-CL, the transistor TR, the first electrode AE and the pixel defining layer PDL of the light-emitting element layer DP-ED.

For example, in an embodiment, the lower shield pattern BML may overlap the entirety of the second pixel unit AR1'. In an embodiment, the lower shield pattern BML may overlap the polarization part PP and may not overlap the non-polarization part NP.

The non-polarization part NP may be a portion overlapping the buffer layers BFL1 and BFL2, the insulating layers 10, 20, 30, 40, 50, and 60, and the upper insulating layer TFL.

Figure 14:
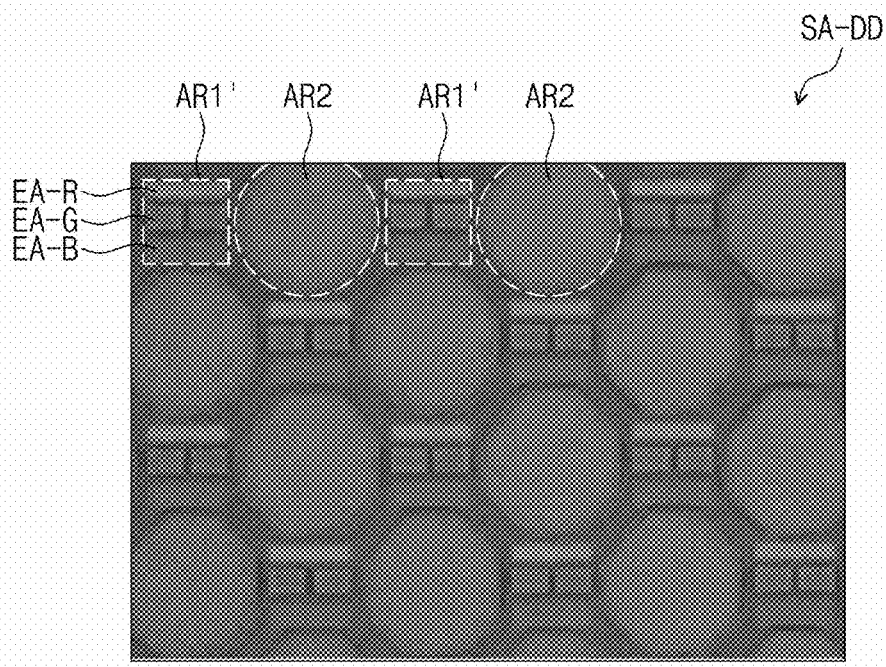
FIG. 14 is a plan view of a sensing region in the electronic apparatus of FIG. 1.

FIG. 14 is a plan view image of an electronic apparatus according to an embodiment. FIG. 14 illustrates a plan view image of a portion corresponding to a sensing region SA-DD in an electronic apparatus DD (e.g., in FIG. 1) according to an embodiment. The sensing region SA-DD may include a second pixel unit AR1' and a non-pixel unit AR2. The second pixel unit AR1' may include a plurality of light-emitting regions EA-B, EA-G, and EA-R. The arrangement shape of the light-emitting regions EA-B, EA-G, and EA-R included in the second pixel unit AR1' included in the electronic apparatus according to an embodiment illustrated in FIG. 14 may be the same as the arrangement shape of the light-emitting regions of the second pixel unit AR1' described above in FIG. 11 and the like.

Meanwhile, in the electronic apparatus according to an embodiment illustrated in FIG. 14, the shape of the non-pixel unit AR2 may be a circular shape or a polygonal shape when viewed in a plane. The portion referred to as the non-pixel unit AR2 and the non-polarization part of the polarization plate may correspond to each other. For example, the shape of the non-polarization part NP (e.g., in FIG. 13) in an embodiment may be a circular or polygonal shape corresponding to the portion referred to as the non-pixel unit AR2.

The light transmittance at the non-polarization part corresponding to the portion referred to as the non-pixel unit AR2 may be greater than the light transmittance of the polarization plate at other portions excluding the portion referred to as the second pixel unit AR1'.

In the image illustrated in FIG. 14, the portion between the second pixel units AR1', the portion between the second pixel units AR1' and the non-pixel units AR2, and the portion between the non-pixel units AR2 may be the portion corresponding to the polarization part PP (e.g., in FIG. 13) of the polarization plate. The second pixel units AR1' may be regions including a metal pattern of a circuit layer, and the non-pixel units AR2 may be regions that do not include a metal pattern of the circuit layer.

Figure 15:
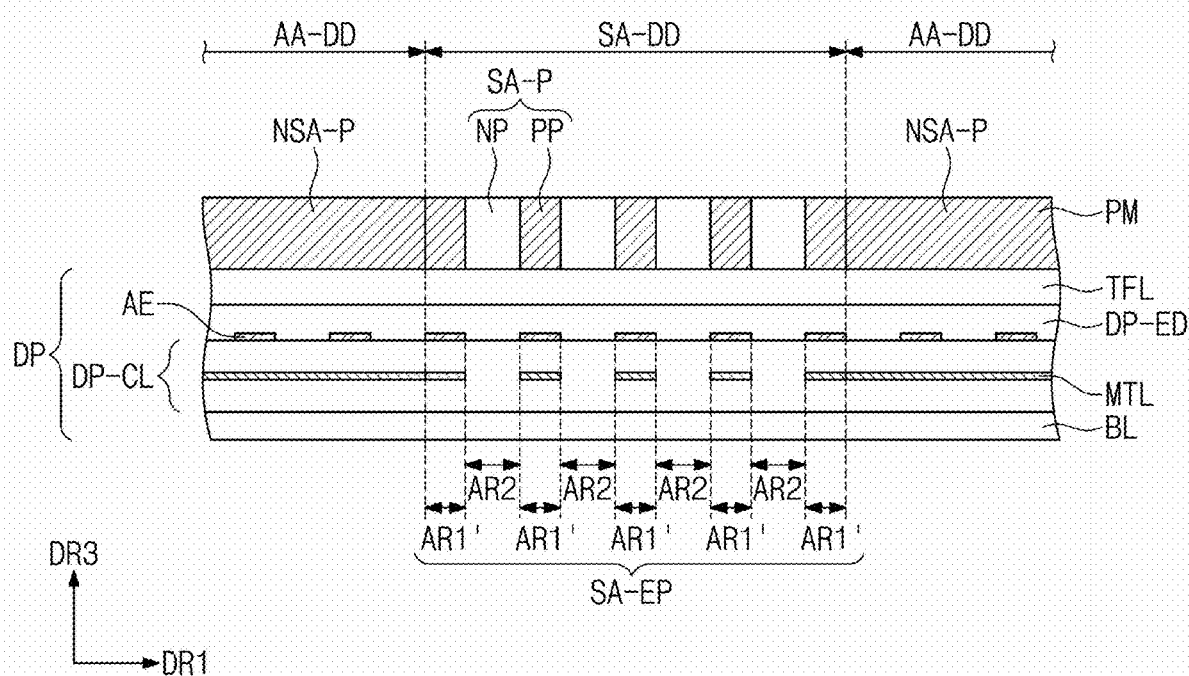
FIG. 15 is a cross-sectional view of another embodiment of the display panel and the polarization plate of the electronic apparatus of FIG. 2.

FIG. 15 is a cross-sectional view illustrating a portion of an electronic apparatus according to an embodiment. Referring to FIG. 15, the electronic apparatus according to an embodiment may include a display panel DP and a polarization plate PM disposed on the display panel DP. In an embodiment, the display panel DP includes a base layer BL, a circuit layer DP-CL disposed on the base layer BL, and a light-emitting element layer DP-ED. In the display panel DP, an upper insulating layer TFL may be disposed on the light-emitting element layer DP-ED.

The circuit layer DP-CL may include a metal pattern MTL. The metal pattern MTL may refer to a light blocking portion provided by each of patterns, such as semiconductor patterns, conductive patterns, connecting lines and signal lines, which are formed in the circuit layer DP-CL, and a combination thereof.

FIGS. 12, 13, and 15 illustrate the metal pattern MTL as a single layer such as a single semiconductor pattern, a single conductive pattern, a single connection line, or a single signal line, but embodiments are not limited thereto. For example, the metal pattern MTL may be formed in a single layer or a multilayer with a shape in which those selected from among semiconductor patterns, conductive patterns, or signal lines are combined to each other. For example, referring to FIGS. 12, 13, and 15, the metal pattern MTL may be a portion provided by a combination of the lower shield pattern BML, the transistor TR, the connection electrode CNE, etc.

The metal pattern MTL may be a portion at which a first polarization region NSA-P and a second polarization region SA-P overlap. The non-polarization part NP of the second polarization region SA-P may be a portion that does not overlap the metal pattern MTL.

In an embodiment, the second display region SA-EP may include non-pixel units AR2 that do not include the metal pattern, and pixel units AR1' including the metal pattern MTL. The non-pixel units AR2 may be referred to as non-pixel regions and the pixel units AR1' may be referred to as pixel regions. For example, in an embodiment, the metal pattern MTL may not be disposed in the non-pixel regions referred to as the non-pixel units AR2.

In an embodiment, the light-emitting element layer DP-ED of the display panel DP may include the first electrode AE formed by a patterning process. The first electrode AE may not be included in the non-pixel region of the second display region SA-EP. The pixel region may include the patterned first electrode AE.

In an embodiment, the polarization plate PM disposed on the display panel DP includes a first polarization region NSA-P and a second polarization region SA-P. The second polarization region SA-P overlapping the second display region SA-EP may include a polarization part PP and a non-polarization part NP. The average light transmittance of the second polarization region SA-P may be greater than the average light transmittance of the first polarization region NSA-P.

The polarization part PP of the second polarization region SA-P may overlap at least one among the metal pattern MTL or the first electrode AE. In addition, the non-polarization part NP of the second polarization region SA-P may not overlap both the metal pattern MTL and the first electrode AE.

In the electronic apparatus according to an embodiment, an electronic module EM (e.g., in FIG. 4) may be disposed under the display panel DP so as to overlap the second polarization region SA-P. For example, the polarization plate PM may include the non-polarization part NP in a sensing region SA-DD in which the electronic module EM (e.g., in FIG. 4) is disposed such that the polarization plate PM may have high light transmittance. In addition, in the electronic apparatus according to an embodiment, the polarization part PP of the polarization plate PM may be provided so as to overlap a light blocking portion such as the metal pattern MTL or the first electrode AE included in the display panel, and remaining portions excluding the polarization part PP in the second polarization region SA-P may be the non-polarization part NP. Accordingly, the electronic apparatus according to an embodiment may enhance or improve the sensitivity of the electronic module without degradation in the image quality by providing a transmissive part corresponding to the non-pixel region.

In addition, the electronic apparatus according to an embodiment may include, in the non-polarization part, all remaining portions excluding the portion overlapping the light blocking portion such as the metal pattern included in the display panel in the second polarization region of the polarization plate overlapping the electronic module. Accordingly, the electronic apparatus according to an embodiment may exhibit or have high light transmittance in the second polarization region, and exhibit or have improved display quality and superior electronic module sensitivity in the sensing region corresponding to the second polarization region of the electronic apparatus.

Figure 16:
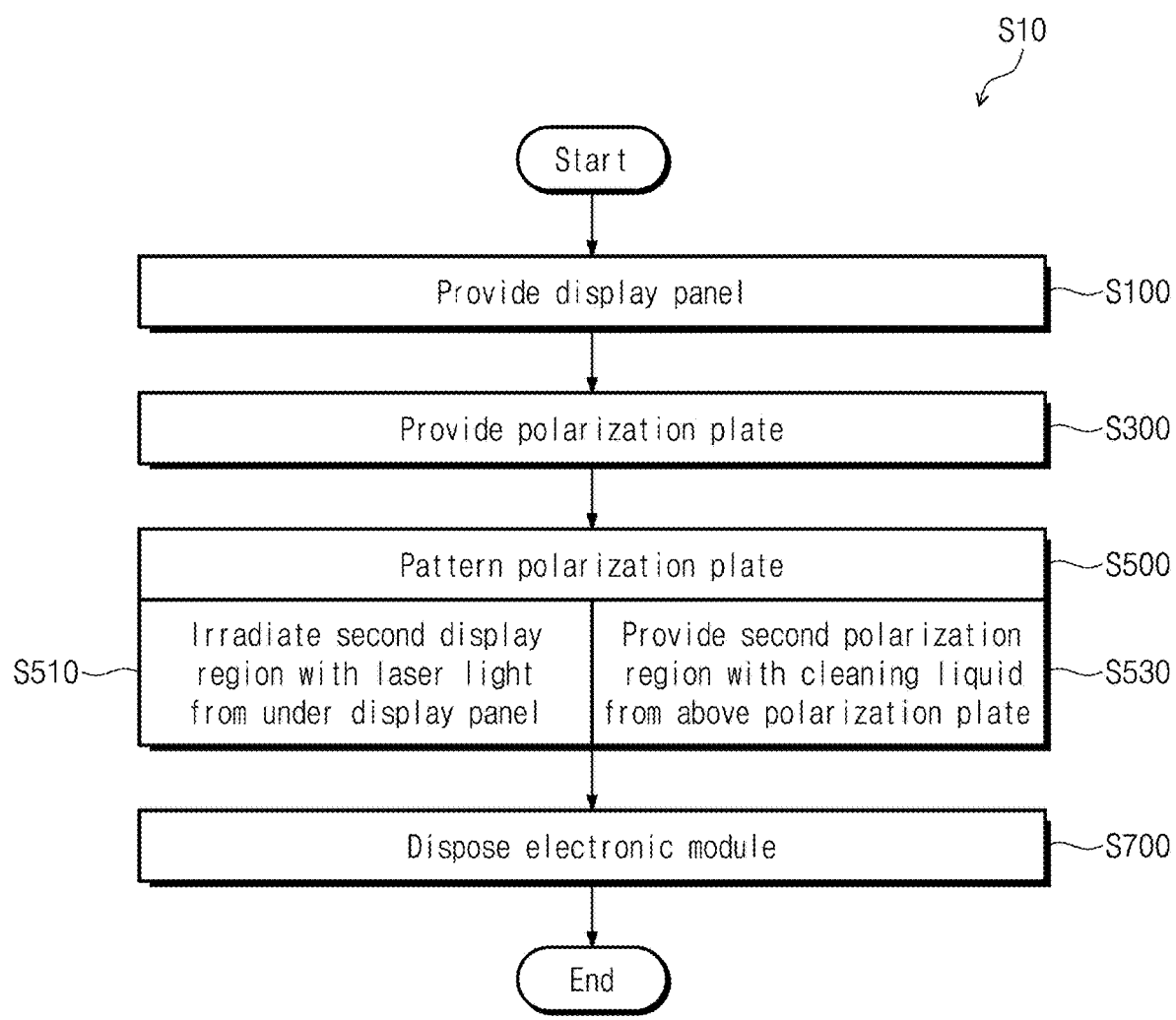
FIG. 16 is a flowchart illustrating a manufacturing method for the electronic apparatus of FIG. 1 according to the principles of the invention.
Figure 17:
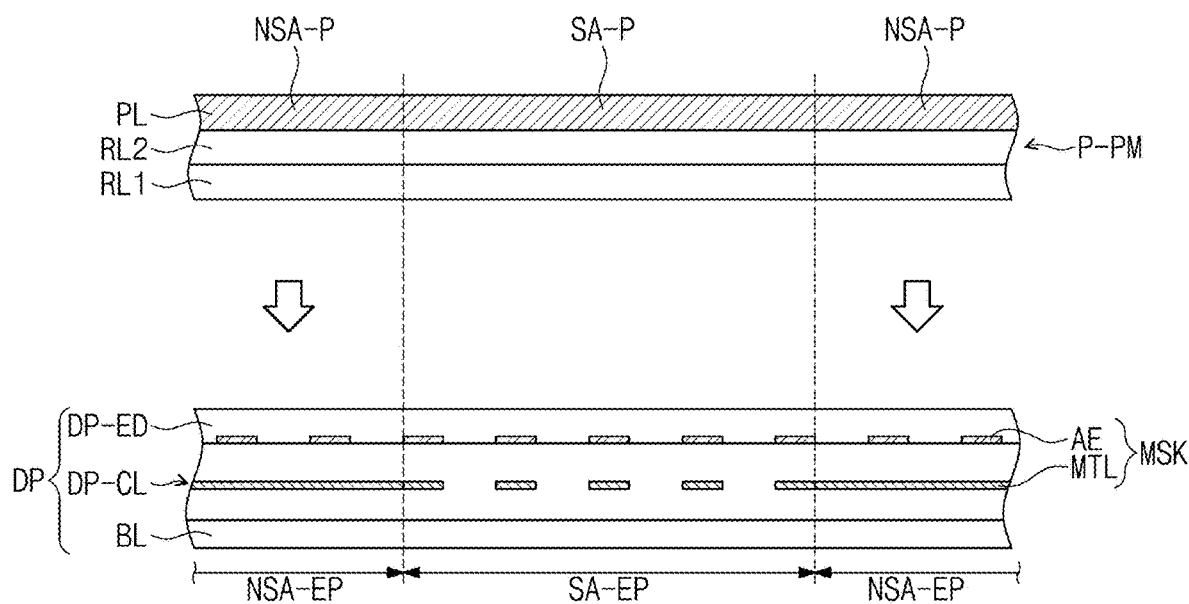
FIGS. 17, 18, and 19 are views each schematically illustrating steps of a manufacturing method for the electronic apparatus of FIG. 1.
Figure 18:
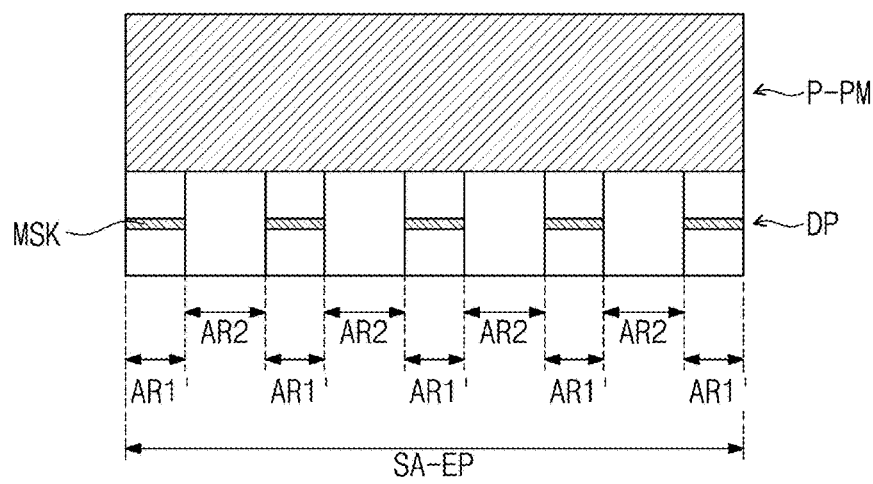
Figure 19:
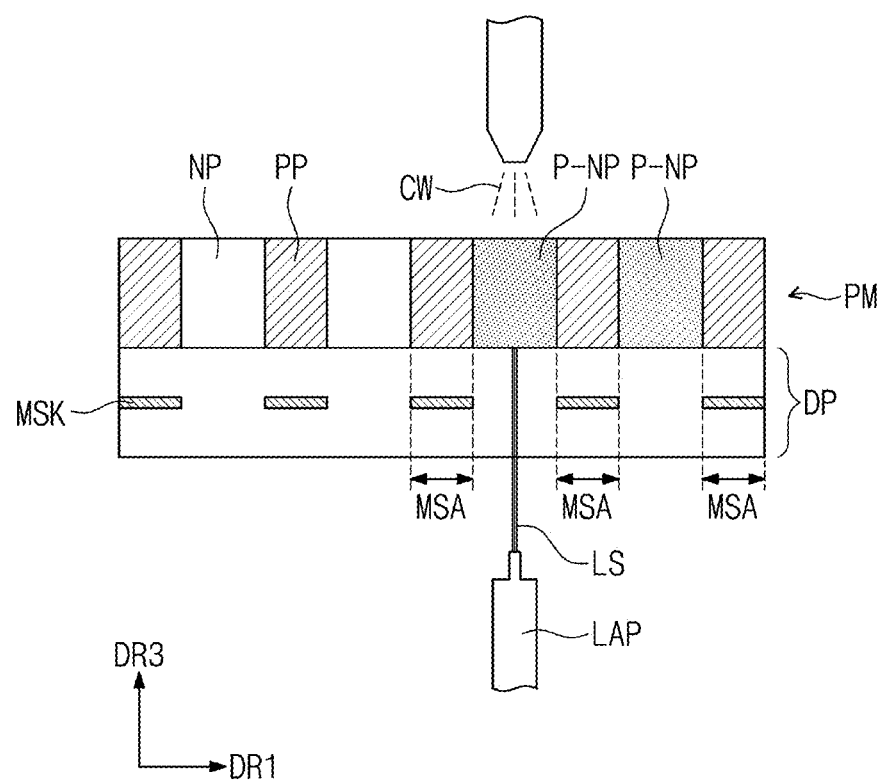

Hereinafter, a manufacturing method for an electronic apparatus according to an embodiment will be described with reference to the accompanying drawings. FIG. 16 is a flowchart for a manufacturing method for an electronic apparatus according to an embodiment. FIGS. 17, 18, and 19 are views schematically illustrating the steps of the manufacturing method for an electronic apparatus of an embodiment.

Hereinafter, in the description on the manufacturing method for an electronic apparatus according to an embodiment to be described with reference to FIGS. 16, 17, 18, and 19, the contents overlapping the description on the electronic apparatus according to an embodiment described with reference to FIGS. 1 to 15 will not be described again. In addition, in the description on the manufacturing method for an electronic apparatus according to an embodiment to be described with reference to FIGS. 16, 17, 18, and 19, the above-described portion the electronic apparatus according to an embodiment may be applied the same to the portion on the configurations of the electronic apparatus.

The manufacturing method S10 for an electronic apparatus according to an embodiment may include a step S100 of providing a display panel, a step S300 of providing a polarization plate, and a step S500 of patterning the polarization plate. The manufacturing method S10 for an electronic apparatus according to an embodiment may include, after the step S500 of patterning a polarization plate, a step S700 of disposing an electronic module. The electronic module may be disposed so as to overlap a second polarization region of the patterned polarization plate.

FIGS. 17 and 18 schematically illustrate the step S100 of providing a display panel and a step S300 of providing a polarization plate, and FIG. 19 schematically illustrates the step S500 of patterning the polarization plate.

Referring to FIGS. 17 and 18, in the step S100 of providing a display panel, the display panel DP may include a first display region NSA-EP and a second display region SA-EP. The second display region SA-EP may be a portion having a lower pixel density than the first display region NSA-EP.

In the step S300 of providing a preliminary polarization plate P-PM, the polarization plate P-PM including a first polarization region NSA-P and a second polarization region SA-P is provided on the display panel DP. The first polarization region NSA-P may be provided so as to correspond to the first display region NSA-EP, and the second polarization region SA-P may be provided to correspond to the second display region SA-EP.

Meanwhile, the preliminary polarization plate is referred to as the reference indicator "P-PM" in the illustration of FIGS. 17 and 18, and the reference indicator "P-PM" is used to distinguish the preliminary polarization plate P-PM from the polarization plate PM. For example, the preliminary polarization plate P-PM may have the state before the polarization plate PM is patterned so as to include a non-polarization part NP. For example, the polarization plate PM may be formed by patterning the preliminary polarization plate P-PM.

The display panel DP may include a base layer BL, a circuit layer DP-CL including a metal pattern MTL, and a light-emitting element layer DP-ED including a first electrode AE. The metal pattern MTL and the first electrode AE may correspond to a mask MSK that blocks light. FIG. 17 illustrates a configuration in which the single-layer metal pattern MTL and the first electrode of the light-emitting element layer DP-ED are only included in the mask MSK, but the mask MSK may also include the configuration of another light blocking portion in the display panel DP. For example, an opaque layer included in the circuit layer DP-CL may be used as the mask MSK.

For example, in the description on the electronic apparatus according to an embodiment described with reference to FIGS. 1 to 15, the configuration of semiconductor patterns, conductive patterns, connection lines, signal lines etc., which are included in the circuit layer DP-CL and block laser light, and the pixel defining layer and the like, which are included in the light-emitting element layer DP-ED and having a light blocking function, may be included in the mask MSK.

In the second display region SA-EP, the mask MSK is a portion that is included in the pixel unit AR1' and is not included in the non-pixel unit AR2.

FIG. 19 is a view schematically illustrating the step S500 of patterning the polarization plate. Referring to FIGS. 16, 17, 18, and 19, the step S500 of patterning the polarization plate may include a step 510 of irradiating laser light in the second display region SA-EP, and a step S530 of providing a cleaning liquid to the second polarization region above the polarization plate. For example, in the step 510, the laser light may be irradiated from under the display panel.

In an embodiment, the polarization plate PM may include, on the uppermost layer thereof, a polarizer layer PL (e.g., in FIG. 5A), and the polarizer layer may include a polymer film and light absorbers adsorbed onto the polymer film (e.g., dispersed in the polymer film). The step S510 of irradiating the laser light in the second display region SA-EP may include the step of detaching the light absorbers adsorbed onto the polymer film.

The emitted laser light LS may be light selected from the wavelength range of about 340 nm to about 810 nm. The laser light LS may be continuous wave laser or pulse laser. For example, the laser light may discharge or emit light in the green wavelength range.

A light source LAP that provides the laser light LS may be disposed under the display panel DP and provide the laser light LS while moving along the first direction axis DR1. The laser light LS may be blocked at the mask MSK which is an opaque pattern layer disposed in the circuit layer DP-CL, and pass through the display panel at the portion in which the mask MSK is not disposed, and be provided to the polarization plate PM. The laser light LS may be provided in the direction to the polarization plate PM under the base layer BL of the display panel DP.

Meanwhile, a separate patterning mask may also be provided under the display panel aside from the mask MSK disposed in the circuit layer DP-CL. The laser light LS may be provided to the polarization plate PM by passing through the patterning mask disposed under the display panel DP.

Meanwhile, FIG. 19 illustrates that the laser light LS is provided using a single light source LAP, but embodiments are not limited thereto. For example, a plurality of light sources LAP may be disposed under the display panel DP and provide laser light LS to portions that are not blocked by the mask MSK.

The laser light LS may not pass through blocked regions MSA blocked by the mask MSK, and the laser light LS is emitted through projection regions between the blocked regions MSA. A preliminary non-polarization part P-NP before emitting laser light LS may be a portion having the same configuration as the polarization part PP. The preliminary non-polarization part P-NP may be formed as a non-polarization part NP by providing the laser light LS and a cleaning liquid CW.

In the step 530 of providing a cleaning liquid to the second polarization region above the polarization plate, the cleaning liquid may be provided to a polarizer layer (e.g., in FIG. 5A) which is the uppermost layer. The step S530 of providing a cleaning liquid to the second polarization region above the polarization plate may include the step of extracting light absorbers detached from the polymer film through the step S510 of irradiating the laser light.

For example, in the step S530 of providing a cleaning liquid, the cleaning liquid CW is provided on to the polarizer layer by dissolving and extracting a dichromic dye or iodine from the polarizer layer. The cleaning liquid CW may be a neutral solution. The cleaning liquid CW may be a solution having a pH value from about pH 6 to about pH 8. For example, the cleaning liquid CW may be water, or an organic solvent. The cleaning liquid CW may be deionized water. In addition, the cleaning liquid may include alcohol, acetone, ethyl acetate, or the like.

The cleaning liquid CW may be provided in a liquid phase through a spray method, may be provided on the polarization plate in a steam form through a steam jet method, or may be provided to the polarization plate using a dipping method.

The step S530 of providing a cleaning liquid may be performed at the room temperature. In addition, unlike this, the step S530 of providing a cleaning liquid may be performed at a high temperature. In this case, the step 530 may be performed at a temperature of the vaporization temperature or lower.

The step S510 of irradiating the laser light in the second display region SA-EP and the step S530 of providing a cleaning liquid to the second polarization region above the polarization plate may be performed at the same step. Performing in the same step is not limited to performing simultaneously in time.

For example, the step S510 of irradiating the laser light in the second display region SA-EP and the step S530 of providing a cleaning liquid to the second polarization region above the polarization plate may be performed in single equipment without moving the display panel or the polarization plate to be processed. In addition, in the entire process of the step S510 of irradiating the laser light in the second display region SA-EP, the step 530 of providing a cleaning liquid may be performed. Meanwhile, the step of providing a cleaning liquid simultaneously with emitting laser light LS may not be performed, and the cleaning liquid may also be provided before and after emitting the laser light LS.

The step S500 of patterning a polarization plate may include patterning the second polarization region SA-P into a polarization part PP and a non-polarization part NP. The non-polarization part NP may be a portion having higher light transmittance than the polarization part PP. The non-polarization part NP may be a portion formed by detaching or removing light absorbers from the polarizer layer.

The step S500 of patterning a polarization plate may include the step of patterning the second polarization region SA-P so as to include a polarization part PP overlapping the mask MSK which includes at least one among the metal pattern or the first electrode and a non-polarization part NP which does not overlap the metal pattern and the first electrode.

A manufacturing method for an electronic apparatus according to an embodiment may provide an electronic apparatus exhibiting or having superior display quality even in a portion in which an electronic module is disposed by including a step of patterning a polarization plate with light blocking portions included in a display panel serving as a mask, because a non-polarization part may be patterned without damage to the optical quality of the polarization plate of a portion corresponding to a pixel region. In addition, a manufacturing method for an electronic apparatus according to an embodiment may provide an electronic apparatus having improved transmittance in a portion overlapping the electronic module by performing a step of emitting laser light under the display panel and a step of providing a cleaning liquid above the polarization plate to pattern the polarization plate using a metal pattern of a circuit layer.

An embodiment may provide an electronic apparatus which has improved light transmittance in a portion overlapping an electronic module by including a patterned non-polarization part in a polarization region overlapping the electronic module.

A manufacturing method for an electronic apparatus according to an embodiment includes emitting laser light from under a display panel to pattern a polarization plate and thus may be used to manufacture an electronic apparatus having improved light transmittance in a region overlapping an electronic module.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A manufacturing method of an electronic apparatus comprising the steps of:
   providing a display panel comprising a first display region and a second display region adjacent to the first display region, the second display region having different transmittance from the first display region;
   providing, on the display panel, a polarization plate comprising a first polarization region overlapping the first display region and a second polarization region overlapping the second display region; and
   patterning the provided polarization plate,
   wherein the step of patterning of the polarization plate comprises the steps of:
      irradiating laser light in the second display region from under the display panel; and
      providing a cleaning liquid to the second polarization region from above the polarization plate.

2. The manufacturing method of claim 1, wherein:
   the polarization plate comprises a polarizer layer on an uppermost layer thereof;
   the polarizer layer comprises a polymer film and a light absorber dispersed in the polymer film;

the step of irradiating the laser light in the second display region comprises the step of detaching the light absorber in the polymer film; and the step of providing of the cleaning liquid comprises the step of extracting the detached light absorber.

3. The manufacturing method of claim 2, wherein:

the step of patterning of the polarization plate comprises the step of patterning the second polarization region into a polarization part and a non-polarization part having higher light transmittance than the polarization part; and the non-polarization part is a portion formed by detaching the light absorber from the polymer film.

4. The manufacturing method of claim 2, wherein the display panel comprises:

a base layer;

a circuit layer disposed on the base layer and comprising a metal pattern; and a light-emitting element layer disposed on the circuit layer and comprising a first electrode, a second electrode, and an emission layer disposed between the first electrode and the second electrode, and in the step of irradiating the laser light in the second display region, the laser light is irradiated in a direction to the polarization plate from under the base layer by using at least one among the metal pattern or the first electrode serving as a mask.

5. The manufacturing method of claim 4, wherein the step of patterning of the polarization plate comprises the step of patterning the second polarization region so as to comprise a polarization part that overlaps at least one among the metal pattern or the first electrode and a non-polarization part that does not overlap the metal pattern and the first electrode.

6. The manufacturing method of claim 1, wherein the laser light is selected from a wavelength range of about 340 nm to about 810 nm.

7. The manufacturing method of claim 1, wherein the step of irradiating the laser light in the second display region and the step of providing of the cleaning liquid are performed in a same step.

8. The manufacturing method of claim 1, wherein the step of providing of the cleaning liquid comprises the step of providing the cleaning liquid by using a spray method, a steam jet method, or a dipping method.

9. The manufacturing method of claim 1, wherein the cleaning liquid is a neutral solution.

10. The manufacturing method of claim 9, wherein the cleaning liquid is deionized water.

11. The manufacturing method of claim 1, further comprising the step of disposing an electronic module under the display panel after the step of patterning of the polarization plate.

12. The manufacturing method of claim 11, wherein the step of disposing of the electronic module comprises the step of disposing the electronic module so as to overlap the second display region.

* * * * *